United States Patent [19]

Ash

[11] 4,162,451

[45] Jul. 24, 1979

[54] MESFET-DEVICE SURFACE-WAVE-DEVICE CHANNEL SELECTOR

[75] Inventor: Darrell L. Ash, Garland, Tex.

[73] Assignee: Texas Instruments Incorporated, Dallas, Tex.

[21] Appl. No.: 813,202

[22] Filed: Jul. 5, 1977

[51] Int. Cl.² .............................................. H04B 1/16
[52] U.S. Cl. .................................... 325/451; 325/464
[58] Field of Search ............... 325/442, 451, 464, 465; 358/191

[56] References Cited

U.S. PATENT DOCUMENTS 3,942,120   3/1976   Ham ...................................... 325/451

*Primary Examiner*—Robert L. Richardson

*Attorney, Agent, or Firm*—Melvin Sharp; Richard L. Donaldson; William E. Hiller

[57] ABSTRACT

An improved channel selector for a television receiver includes a metal semiconductor field effect transistor, i.e. MESFET mixer in combination with an acoustic surface wave device filter. The MESFET mixer simultaneously receives a plurality of channels and mixing signals of a selectable frequency, and in response thereto frequency shifts selectable channels to a predetermined center frequency. The MESFET mixer has almost perfect square law characteristics, and accordingly introduces extremely small distortion into the system. The acoustic surface wave device filter has an input coupled to the output of the MESFET mixer. The surface wave device filter provides essentially all of the channel selectivity of the receiver.

12 Claims, 41 Drawing Figures

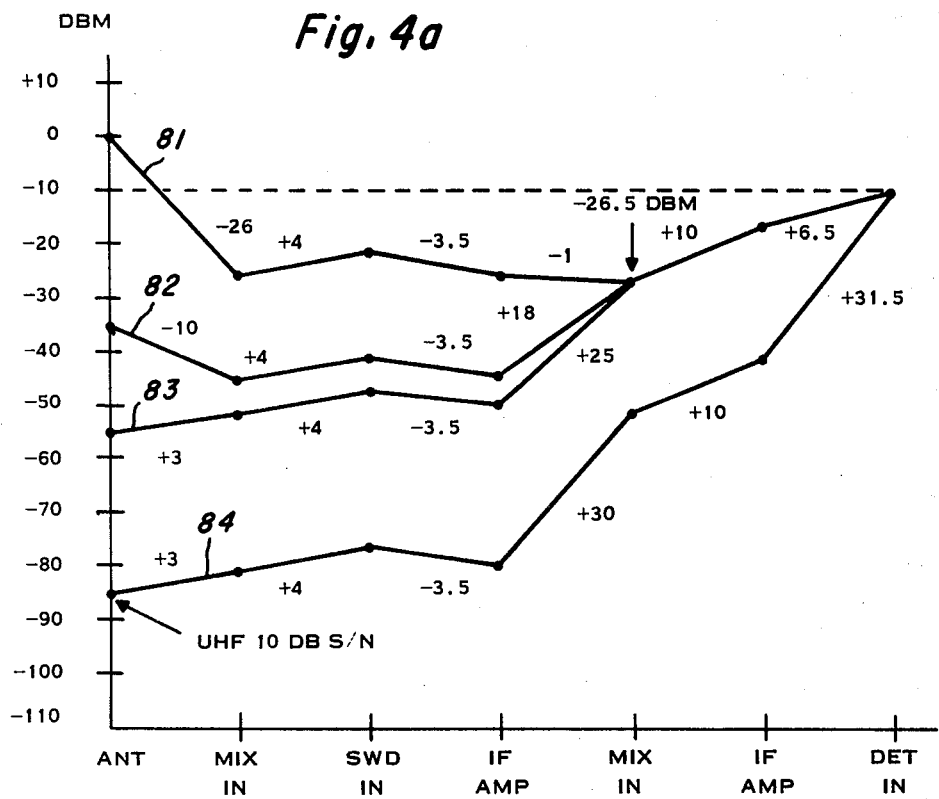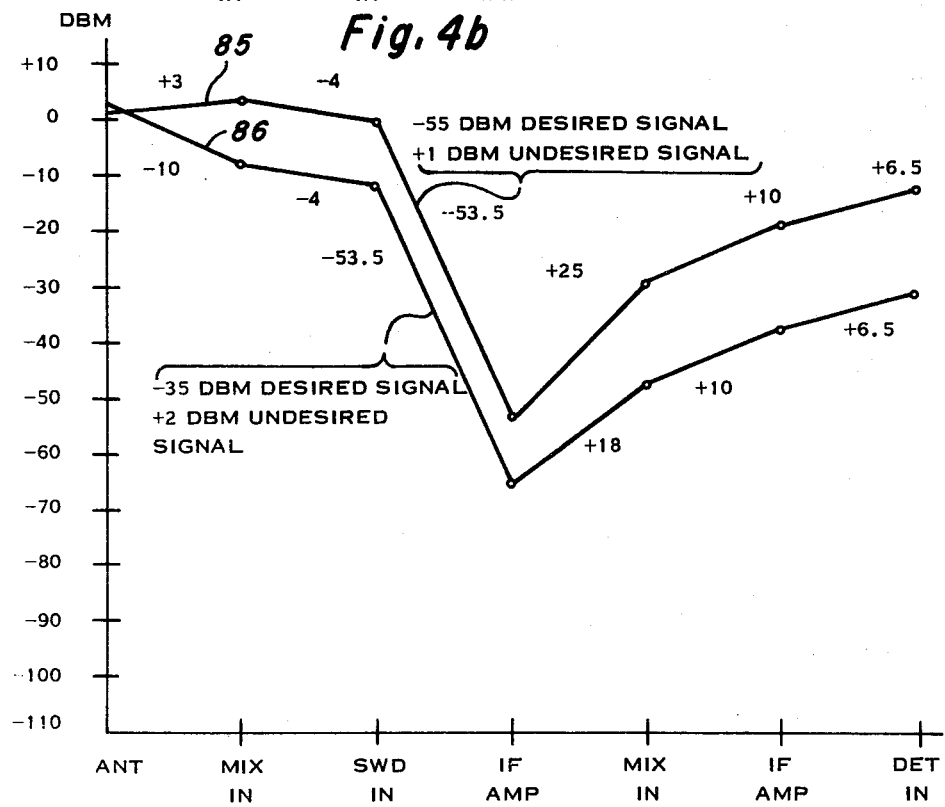

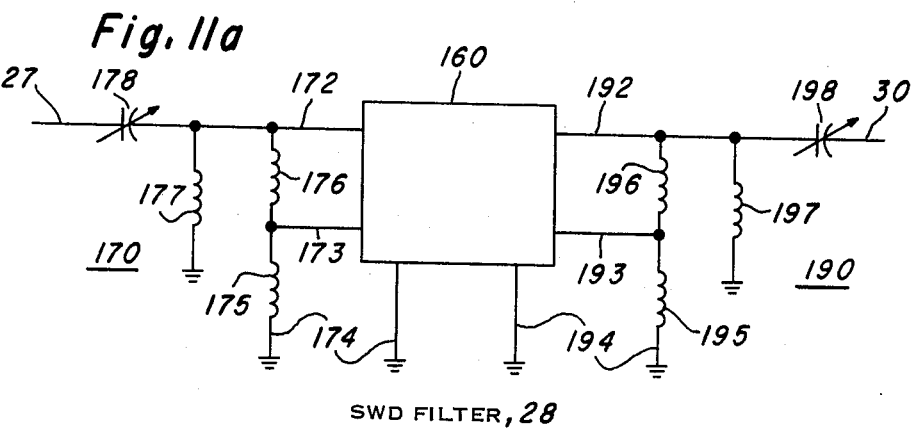
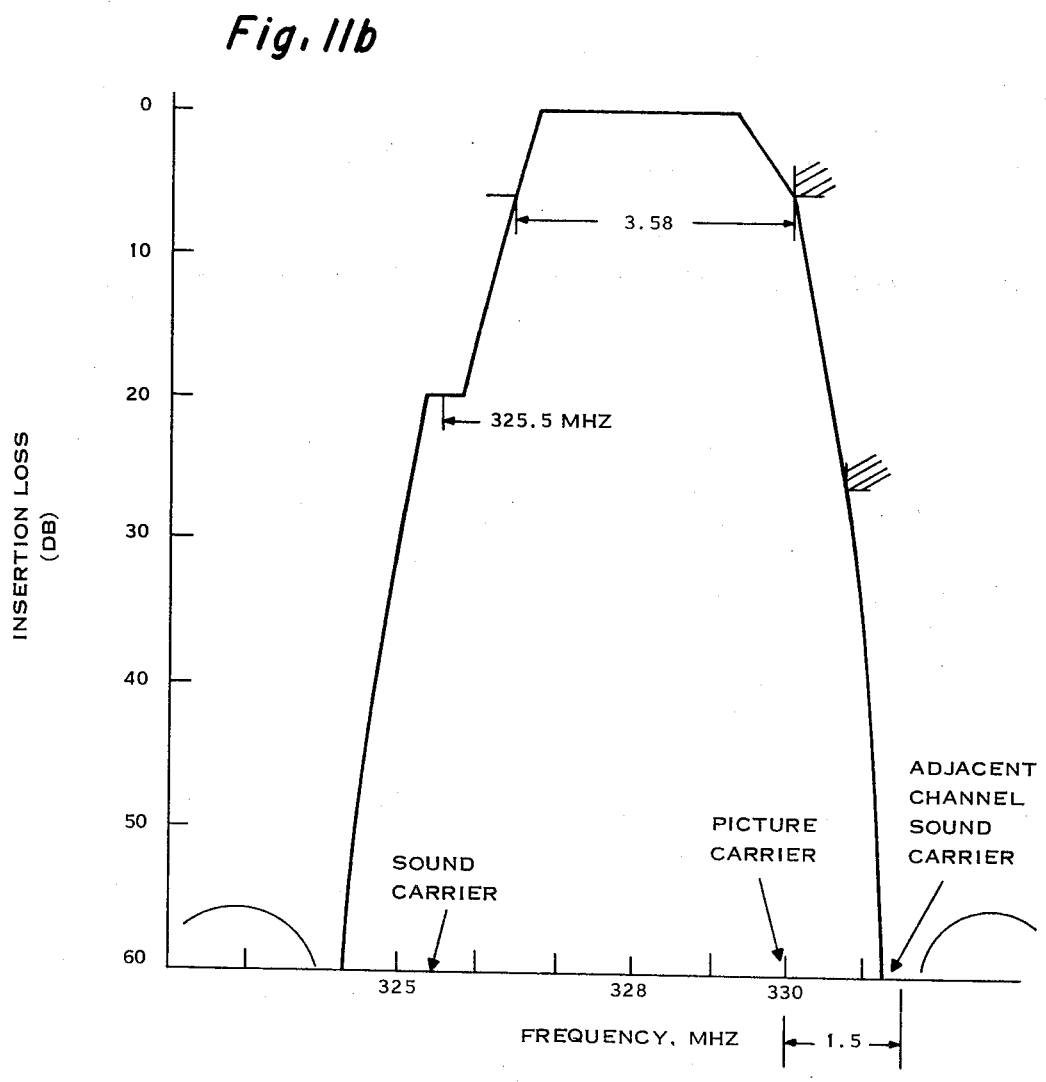

$|X_L| = R \sin \beta$ $|X_C| = \dfrac{R \sin \beta}{(1 - \cos \beta)}$

CIRCUIT 170

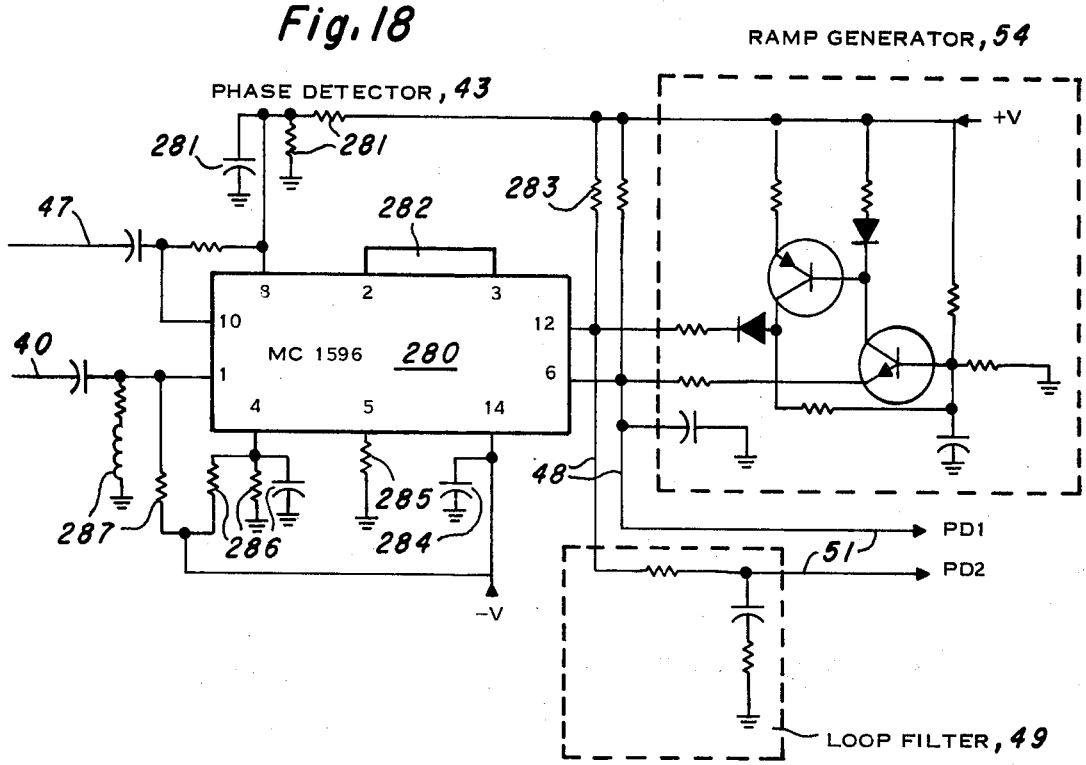
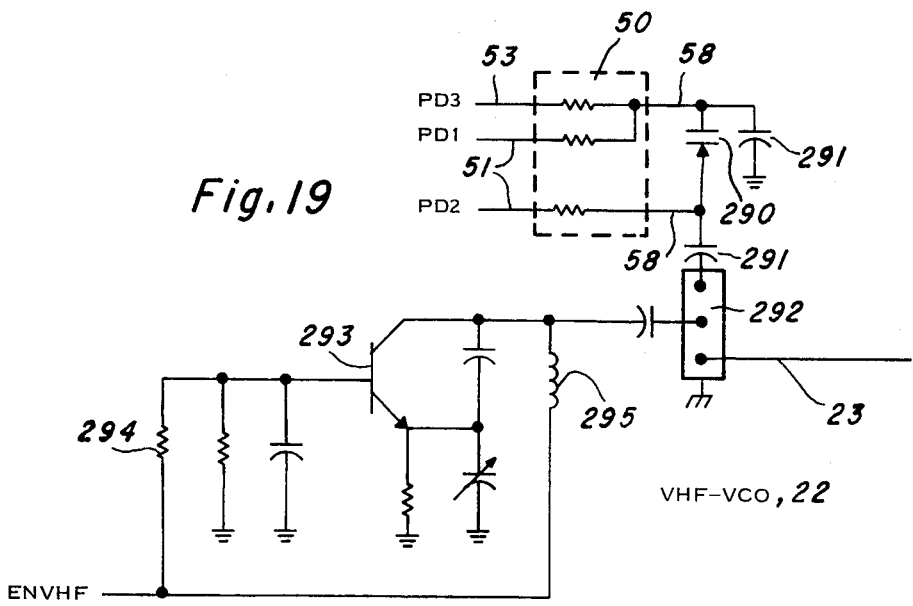

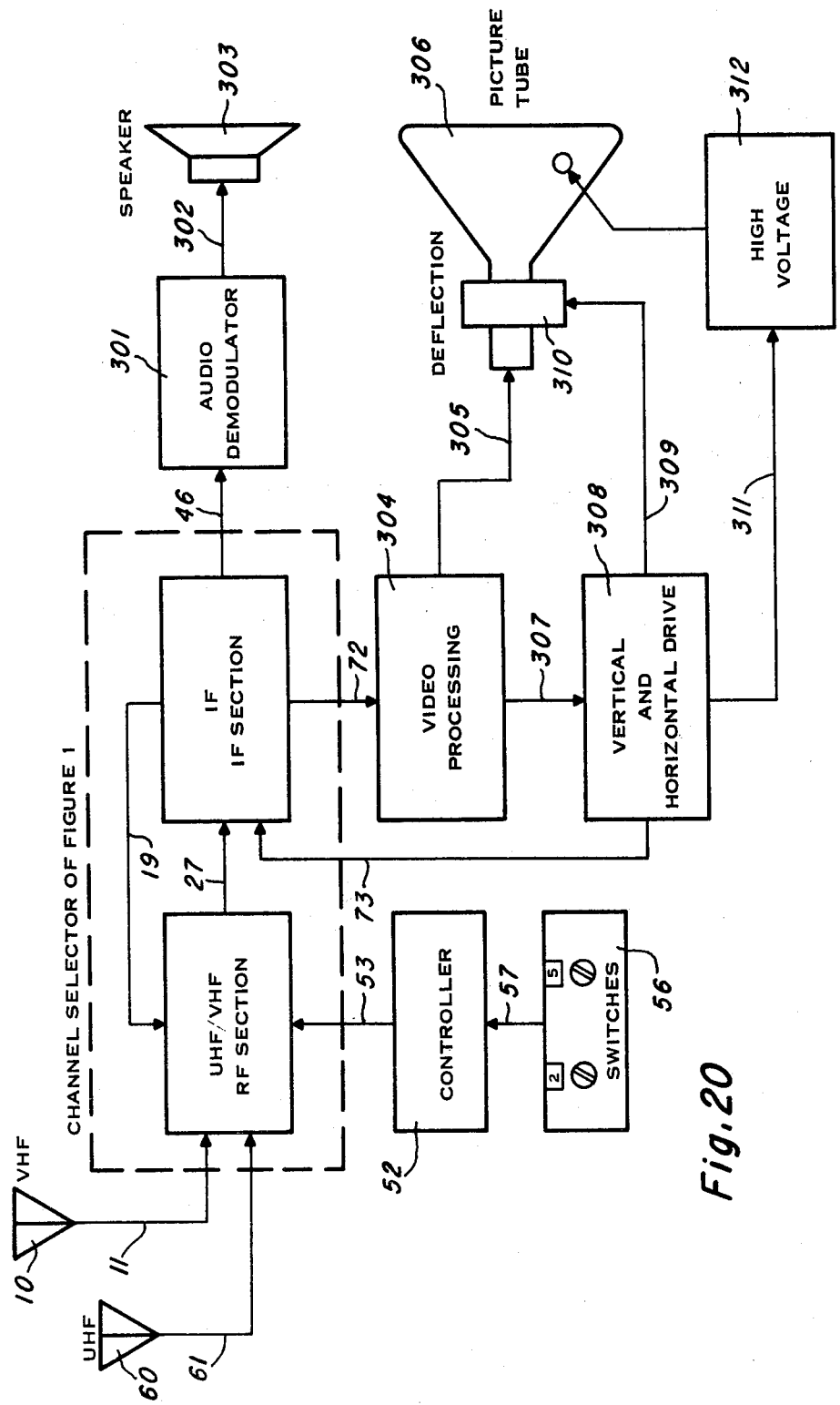

MESFET-DEVICE SURFACE-WAVE-DEVICE CHANNEL SELECTOR

BACKGROUND OF THE INVENTION

This invention relates to electronic devices for receiving a plurality of radiated electromagnetic signals, filtering a selectable channel of frequencies from the received signals, and demodulating the signals of the selected filtered channel. More particularly, the invention relates to television receivers.

Television receivers of the prior art include a radio frequency (RF) section and an intermediate frequency (IF) section. The RF section includes RF filters which are tuned to coarsely filter a band of channels centered about a manually selected channel. The output of the RF filter couples to the input of an RF amplifier. Typically, total gain through the RF section is at least 20 dB to 30 dB. This gain increases the amplitude of signals within the selected channel and additionally makes the noise figure of the system essentially independent of subsequent elements in the receiver. The output of the RF amplifier couples to one input of a mixer, while a second input of the mixer receives mixing signals of a selectable frequency. The selectable frequency is generated such that the selected channel is frequency shifted to approximately 45 MHZ. The output of the mixer couples to a channel selection filter which provides a relatively high impedance path for frequencies outside of the selected channel, and a relatively low impedance path for signals inside the selected channel. Signals at the output of the channel selection filter are therefore primarily comprised of frequencies within the selected channel.

Each television channel contains audio information, video information, and frame synchronizing information. The output of the channel selection filter couples to an audio demodulator which separates the audio information from the selected channel; and the output of the audio demodulator couples to a speaker which generates audible sounds. Similarly, the output of the channel selection filter couples to a video processing unit which separates the video and frame synchronizing information from the selected channel; and the output of the video processor couples to a picture tube which converts the video and frame synchronizing information to pictures.

As described above, a basic function which all television receivers perform is to frequency shift the selected channel from an RF frequency to a predetermined IF frequency by a mixing device. This mixing operation has been performed in the past by a variety of nonlinear devices. These devices include vacuum tubes, diodes, MOSFET transistors, and bipolar transistors. However, the prior art mixers also generate output terms which are proportional to their inputs cubed or raised to higher order odd powers. In a television receiver, these odd power terms may generate interfering signals in the desired channel. For example, such interfering signals are generated when signals are present in channels on one side of the selected channel which are one and two channels removed from the selected channel. This phenomena is known as intermodulation distortion. Similarly, the cubic terms and higher order odd power terms generate interfering signals in the desired channel when a carrier with amplitude modulation is present in any one of the undesired channels. This phenomena is known as cross modulation distortion. The frequencies which are generated in a desired channel as a result of intermodulation distortion or cross modulation distortion cannot be separated from the information signals lying therein. Thus, as the magnitude of the interfering frequencies increases, perceptible picture distortion or sound distortion occurs.

A principal advantage of the television receiver herein disclosed is that it has greatly reduced cross modulation and intermodulation distortion. This is accomplished to a large extent by means of a unique RF mixer. The mixer utilizes a MESFET transistor which has almost perfect square law current-voltage characteristics. Since the MESFET mixer has almost perfect square law characteristics, the mixer introduces extremely small distortion into the system. In particular, the MESFET mixer handles an interfering signal level of greater than +6 dBm on its output with less than 1% cross modulation distortion and −40 dB intermodulation distortion products.

The square law current-voltage characteristics of a MESFET transistor and their application to reduce intermodulation and cross modulation distortion in a television receiver are not taught by the prior art. In the past, MESFET devices were used primarily to achieve high speed operation. For example, they were utilized in pico-second digital switching circuits. See, for example, a paper by Cahen et al entitled "A Subnanosecond Switching Circuit" which was presented at the IEEE International Solid State Circuits Conference on Feb. 14, 1974 at Orsay, France. See also, for example, a paper entitled "X and KU Band Amplifiers with GaAs Schottley Barrier Field Effect Transistors" by Weiner Baechtold in the IEEE Journal of Solid State Circuits Volume, SC-8, No. 1, February 1973. High speed digital switching is combined with high speed linear amplification in a high speed pulse amplitude modulation device that is described in the paper entitled "Performance of Dual Gate GaAs MESFETS as Gain Controlled Low Noise Amplifiers and High Speed Modulators" by Liechti in the IEEE Transactions on Microwave Theory and Techniques Vol. MIT-23, No. 6, June 1975. However, all of the devices in the above cited references only utilize MESFETS for high speed.

The television receiver herein disclosed is also novel in that it includes a unique combination of surface wave device technology with MESFET device technology in the RF-IF section. A MESFET mixer provides frequency shifting while channel selectivity is provided by a single low loss surface acoustic wave device (i.e. SWD) bandpass filter. This SWD filter has a sharp passband—stop band transition. For example, signals 1.5 MHZ above the sound carrier in the passband are attenuated by greater than 65 dB. Conversely, the filter has a low insertion loss for signals in the passband. The preferred embodiment is a unidirectional SWD filter which has an inband insertion loss of less than 3.5 dB.

The SWD filter also has a high center frequency and a passband which is a small percentage of the center frequency. Thus, the SWD filter is readily implemented with piezoelectric material having a relatively low coefficient of coupling. Quartz has such a characteristic, and it is a preferred substrate material. By comparison, prior art television receivers have employed SWD filters but only at a much lower IF frequency of 45 MHZ. Accordingly, their passband was a relatively large percentage of their center frequency and thus the devices needed piezoelectric material having a relatively large coefficient of coupling-such as lithium niobate. Lithium niobate, however, has piezolelectric characteristics which are highly sensitive to temperature change in the 0°–70° C. temperature range. As a result, they require temperature compensation circuitry. By comparison, the piezoelectric characteristics of quartz are relatively insensitive to temperature change in the 0°–70° temperature range.

Accordingly, it is one object of the invention to provide an improved device for receiving signals in selected channels from a plurality of non-overlapping channels.

Another object of the invention is to provide a television receiver having improved reception.

Another object of the invention is to provide a television receiver simultaneously having significantly reduced intermodulation distortion, significantly reduced cross modulation distortion, and improved out-of-band signal rejection.

Another object of the invention is to provide a television receiver having a MESFET mixer for frequency shifting a selected channel to a predetermined high IF frequency.

Another object of the invention is to provide a channel selector for a television receiver which includes a MESFET mixer in combination with an acoustic surface wave device filter for channel selection.

Another object of the invention is to provide a channel selector for a television receiver having a MESFET mixer in combination with a low loss unidirectional surface wave device filter.

Another object of the invention is to provide a channel selector for a television receiver having a MESFET mixer in combination with a surface wave device filter which requires no temperature compensation.

SUMMARY OF THE INVENTION

These and other objects are accomplished in accordance with the invention by providing a channel selector for a television receiver including a MESFET mixer in combination with an acoustic surface wave device filter. The MESFET mixer simultaneously receives a plurality of channels and mixing signals of a selectable frequency, and in response thereto frequency shifts selectable channels to a predetermined center frequency. The MESFET mixer has almost perfect square law characteristics, and accordingly introduces extremely small distortion into the system. In one embodiment, the MESFET mixer handles interfering signal levels of greater than +6 dBm on its output with less than 1% cross-modulation distortion and −40 dB intermodulation distortion products. The acoustic surface wave device (SWD) filter has an input coupled to the output of the MESFET mixer. The SWD filter provides essentially all of the channel selectivity of the receiver. In a preferred embodiment, the SWD filter is a three-phase low-loss unidirectional filter having a finger withdrawal type impulse response. This SWD filter has an in-band insertion loss of ≦3.5 dB, and a stop-band loss at 1.5 MHZ above and below the pass-band of ≧65 dB.

BRIEF DESCRIPTION OF THE DRAWINGS

The novel features believed characteristic of the invention are set forth in the appended claims; the invention itself, however, as well as other features and advantages thereof, may best be understood by referring to the following detailed description of particular embodiments when read in reference to the accompanying drawings, wherein:

FIGS. 4a and 4b are graphs respectively illustrating the amplitude of in-band and out-of-band signals at various points in the channel selector of FIG. 1.

FIG. 9b is an enlarged cross-sectional view taken along the line A—A of FIG. 9a.

FIGS. 9d and 9e are graphs illustrating the operational characteristics of the MESFET transistor shown in FIG. 9a.

FIG. 11a is a circuit diagram of a surface wave device acoustic filter within the channel selector of FIG. 1.

FIG. 11b is a graph illustrating the magnitude-frequency characteristic of the surface wave device included in the filter of FIG. 11a.

FIG. 11c is a perspective view illustrating one embodiment of the surface wave device included in the filter of FIG. 11a.

FIG. 11e is a diagram of a phase shifting circuit for use in the input circuitry of the filter of FIG. 11a.

FIG. 11h is a circuit diagram of the input circuitry included in the filter of FIG. 11a.

FIG. 14b is a top plan view illustrating the surface wave device included in the oscillator of FIG. 14a.

FIG. 18 is a detailed circuit diagram of a phase detector, a ramp-generator, and a loop filter within the channel selector of FIG. 1.

FIG. 19 is a detailed circuit diagram of a voltage controlled oscillator within the channel selector of FIG. 1.

FIG. 20 is a block diagram of a television receiver which includes the channel selector of FIG. 1.

DETAILED DESCRIPTION OF SPECIFIC EMBODIMENTS

Figure 1:
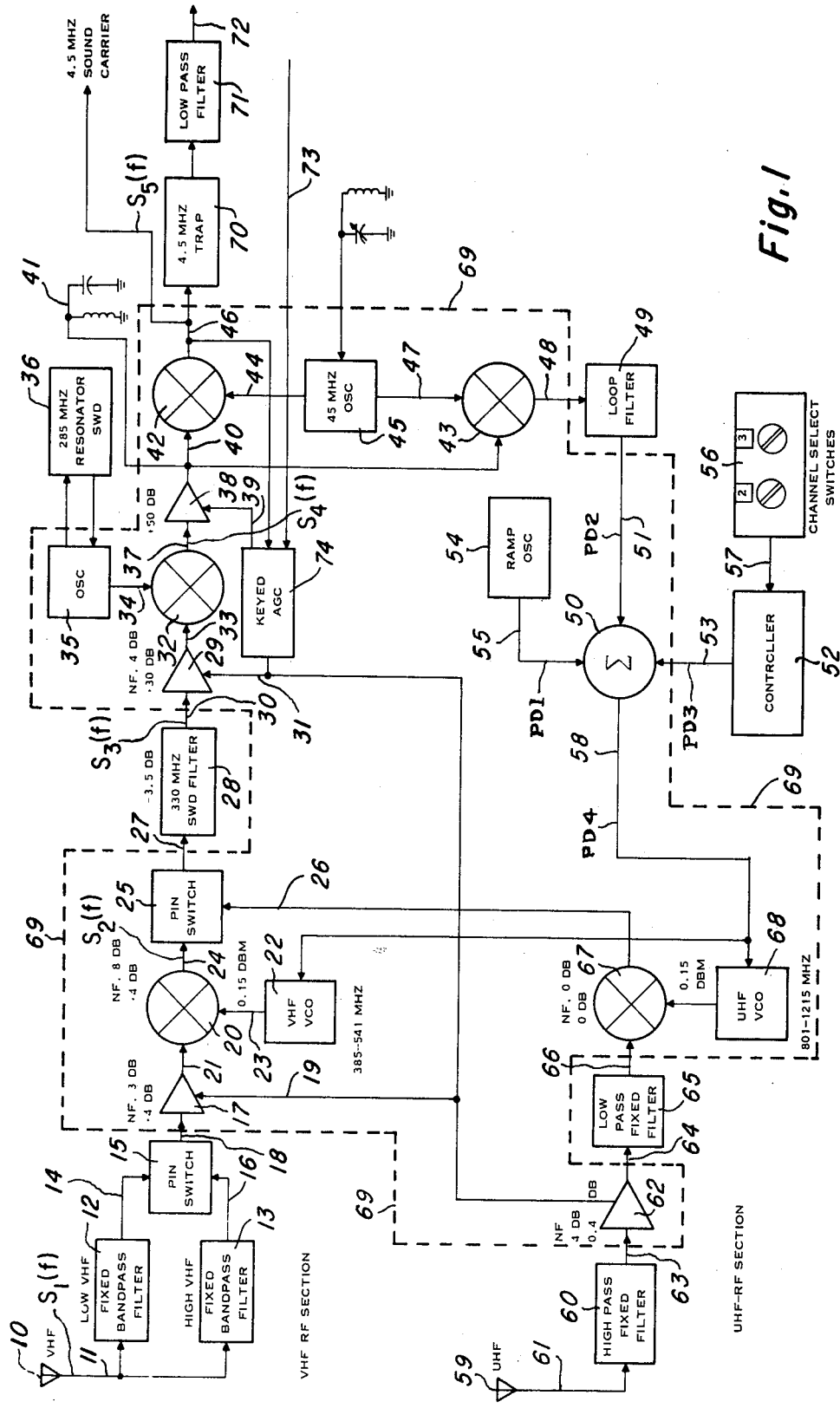
FIG. 1 is a block diagram illustrating a channel selector constructed according to the invention.

Referring to FIG. 1, the channel selecting portion of a television receiver constructed according to the invention is illustrated in block diagram form. The selector includes a VHF antenna 10 having an output coupled via a lead 11 to a fixed bandpass filter 12 and to another fixed bandpass filter 13. Signals on lead 11 are herein designated $S_1(f)$. Filter 12 has a center frequency of 69 MHZ and a 3 dB bandwidth of 34.6 MHZ to thereby permit passage of the low VHF television channels. Similarly, filter 13 has a center frequency of 193 MHZ and a 3 dB bandwidth of 44.5 MHZ to provide filtering of the high VHF television channels. The output of filter 12 is coupled via a lead 14 to one of the inputs of a 2×1 switch 15, while the output of filter 13 is coupled via a lead 16 to a second input of switch 15. Switch 15 operates to select either signals from filter 12 or filter 13. The filter-switch combination inserts approximately a 1 dB loss on signals in the passbands.

The output of switch 15 is coupled to an RF amplifier 17 via lead 18. Amplifier 17 has a variable gain which is controlled by signals on an AGC line 19. The maximum gain of amplifier 17 is approximately 4 dB. The noise figure of the amplifier is approximately 3 dB.

The output of amplifier 17 couples to one input of a MESFET mixer 20 via a lead 21. Mixer 20 has a fixed gain of approximately 4 dB, and a noise figure of approximately 8 dB. A second input of mixer 20 is coupled to a VHF voltage controlled oscillator 22 via a lead 23. Oscillator 22 generates local oscillator (LO) signals on lead 23 of a selectable frequency in the range 385–541 MHZ. In response thereto, mixer 20 frequency shifts the RF signals on lead 21 to a new IF frequency range. The frequency of the LO signals on lead 23 is selected such that the channel to be received is frequency shifted to a predetermined high IF of between 300 MHZ to 400 MHZ. In one embodiment, this predetermined high IF is approximately 330 MHZ. The frequency shifted signals are generated on a lead 24 and are designated $S_2(f)$.

Lead 24 couples to one input of a 2×1 switch 25, while a second input of switch 25 is coupled via a lead 26 to receive frequency shifted UHF television channels. Switch 25 is identical in construction to switch 15. The circuitry for frequency shifting the UHF television channels, which is labeled as UHF RF SECTION, is similar in construction to the VHF-RF section, and is described in detail infra.

The output of switch 25 is coupled to a surface wave device (SWD) filter 28 via a lead 27. Filter 28 has a passband which is shaped to pass only one of the television channels on lead 27. In particular, filter 28 passes the television channel at the predetermined high IF.

The fixed RF filters in combination with the SWD filter provide essentially all the filtering in the system. In a preferred embodiment, filter 28 is a three phase unidirectional filter which has a low insertion loss. Typically, the loss through filter 28 is less than 3.5 dB in the passband. Conversely, out of band signals are greatly attenuated.

The output of filter 28 is coupled to an IF amplifier 29 via a lead 30. The signals on lead 30 are designated herein as $S_3(f)$. Amplifier 29 has a variable gain which is controlled by AGC signals on a lead 31. The maximum gain of amplifier 29 is approximately 30 dB. Thus, amplifier 29 is the first high gain element in the system. To this point, the gain of the system is characterized as being no larger than necessary to obtain the desired system noise figure. Noise figure for amplifier 29 is approximately 4 dB.

The output of amplifier 29 couples to a mixer 32 via a lead 33. A second input of mixer 32 is coupled via a lead 34 to the output of an oscillator 35. Oscillator 35 has a surface wave device resonator 36 as its frequency controlling element. In a preferred embodiment, resonator 36 and oscillator 35 operate to generate a mixing signal on lead 34 having a frequency of 285 MHZ. The 285 MHZ signal on lead 34 is mixed with the signal on lead 33 to thereby generate signals $S_4(f)$ on the output of mixer 32. Signal $S_4(f)$ is similar to signal $S_3(f)$ except that it is shifted down in frequency by 285 MHZ. Thus it has a picture carrier at approximately 45 MHZ.

Additional gain is added to the signal of the selected channel after it has been frequency shifted to the lower IF frequency of 45 MHZ. Mixer 32 adds a fixed gain of +10 dB and the output of mixer 32 couples via a lead 37 to an IF amplifier 38 which has a maximum gain of +50 dB. The gain of amplifier 38 is varied by an AGC signal on a lead 39. By inserting most of the gain at the lower IF frequency, system stability is increased since feedback through parasitic capacitances, radiation, etc. is much less at 45 MHZ than 330 MHZ.

The output of amplifier 38 is coupled via lead 40 to a tank circuit 41, a synchronous detector 42 and the phase detector 43. Tank circuit 41 has a center frequency of approximately 45 MHZ. Synchronous detector 42 has a second input coupled via a lead 44 to an oscillator 45. Oscillator 45 generates clock signals at a fixed frequency of 45 MHZ on lead 44. The signals on lead 44 are in phase with the 45 MHZ picture carrier on lead 40. Detector 42 mixes the signals on leads 40 and 44 to generate output signals $S_5(f)$ on a lead 46. Signal $S_5(f)$ contains the selected television channel with the picture carrier at zero Hz and the sound carrier at 4.5 MHZ. Lead 46 is then coupled to conventional television circuitry for separating the sound signal from the picture signals and for reproducing the sound and the picture from these signals respectively in a conventional manner.

The synchronous clock signal on lead 44 is kept in phase with the picture carrier on lead 40 by means of the phase detector 43 operating in conjunction with oscillator 45. Phase detector 43 generates phase detection signals PD2 on lead 48 which indicate the phase difference between the picture carrier on lead 40 and the oscillator signal on lead 47. Signals PD2 maintain a 90° phase difference between the signals on leads 40 and 47. This phase difference is compensated for by oscillator 45 which maintains a compensating 90° phase difference between the oscillator signals on leads 44 and 47.

To complete the phase locked loop, lead 48 couples to a loop filter 49, and the output of filter 49 couples to a summer 50 via leads 51. Summer 50 has a second input coupled to a controller 52 via a lead 53, and a third input coupled to a ramp oscillator 54 via lead 55. Controller 52 and oscillator 54 operate to provide a coarse voltage for selecting one channel from another. Channel selection switches 56 are coupled to controller 52 via leads 57. Switches 56 generate digital signals on leads 57 indicating the selected channel. Controller 52 contains a digital to analog converter which generates a coarse channel selection voltage on lead 53 in response to the digital signals. The signals on lead 53 are summed with the coarse signals on leads 51 and 55 to thereby provide a loop which is phase locked to the picture carrier of the selected channel. The output of summer 50 is coupled to VHF voltage controlled oscillator 22 via leads 58. Oscillator 22 generates LO signals on lead 23 of a frequency ranging from 385 MHZ to 541 MHZ in response to the phase detection signals on leads 58 thereby completing the loop.

The UHF-RF section of the FIG. 1 channel selector begins with a UHF antenna 59. Antenna 59 is coupled to a high pass filter 60 via a lead 61. Filter 60 has a fixed 3 dB cutoff frequency of approximately 380 MHZ. The output of filter 60 couples to the input of an RF amplifier 62 via a lead 63. Amplifier 62 also has an AGC input which is connected to receive AGC signals on lead 19. The maximum gain of amplifier 62 is 4 dB, and its noise figure is also approximately 4 dB. A low pass filter 65 has its input coupled to the output of amplifier 62. Filter 65 has a fixed 3 dB cutoff frequency of approximately 936 MHZ. Thus, filter 65 in combination with filter 60, pass the entire UHF band and reject other frequencies.

A mixer 67 receives the UHF band of signals from filter 65 via a lead 66. Mixer 67 simultaneously receives mixing signals of a selectable frequency from a UHF voltage controlled oscillator 68. These selectable frequencies range from approximately 801 MHZ to 1215 MHZ. The particular frequency at any time instant is generated in response to channel selection switches 56 so as to frequency shift the selected channel to the predetermined high IF.

The overall operation of the above described FIG. 1 structure is as follows. Antennas 10 and 59 receive radiated electromagnetic signals which include the VHF and UHF frequency spectrum. The signals received by antenna 10 are applied to non-tuned filters 12 and 13 which respectively pass the entire low VHF and high VHF frequency spectrum. Similarly, the signals received by antenna 59 are applied to non-tuned filters 60 and 65 which pass the entire UHF frequency spectrum. Switches 15 and 25 select one of these three frequency spectrums in response to logic signals from the channel selection switches 56.

MESFET mixers 20 or 67 then frequency shift the selected frequency spectrum to a predetermined IF in the 300 MHZ-400 MHZ range. Mixer 20 frequency shifts VHF signals, whereas mixer 67 frequency shifts UHF signals. Both mixers have a large dynamic range over which their output is an almost perfect product of their inputs. As a result, the system has improved performance. For example, mixers 20 and 67 can handle $> +6$ dBm interfering signal levels on their output with less than 1% cross-modulation distortion.

Switch 25 then couples one of the mixers to the input of SWD filter 28. Filter 28 greatly attenuates signals outside the selected channel. In particular, the stopband of filter 28 is notched such that the lower adjacent sound carrier and upper adjacent picture carrier are attenuated by more than 65 dB. All other out of band signals are attenuated by at least 55 dB. Conversely, in band insertion loss of filter 28 is only 3.5 dB.

Output signals from filter 28 are sent to amplifier 29—which is the first high gain component of the system. Amplifier 29 has a maximum gain of 30 dB. In comparison, the total gain of the system before amplifier 29 is less than 10 dB. As a result of the low RF-IF gain, intermodulation distortion and cross modulation distortion is decreased. Further, system stability is improved since high frequency feedback due to parasitic capacitance, radiation, etc. is avoided. At the same time, a low system noise figure is achieved by circuit elements which individually have a low noise figure in combination with a sufficiently high gain.

The low gain RF-IF section also makes feasible integration of all of the channel selectors, except the fixed filters, on a single semiconductor chip. An outline of such a chip is designated by the dashed line 69 of FIG. 1. The process for fabricating the chip includes a combination of steps presently well known for constructing MESFET devices and bipolar devices. A second chip is utilized to construct SWD filter 28 and SWD resonator 36. The fixed filters 12, 13, 60 and 65 are constructed of discrete components.

Signals in the selected channel at the output of amplifier 29 are frequency shifted to 45 MHZ by mixer 32. Then they are further amplified to $-10$ dBm by amplifier 38. The selected channel video signals are then reduced to baseband by synchronous detector 42; while the sound carrier of the selected channel is shifted to 4.5 MHZ. A 4.5 MHZ trap 70 removes the sound from the video signals, and a low pass filter 71 removes all signals except the video of the selected channel. The video signals at the output of filter 71 are sent via lead 72 to video processing circuitry, while the audio signals at 4.5 MHZ on lead 46 are sent to audio processing circuitry. This audio-video circuitry is described infra in conjunction with FIG. 20.

Figure 2A:
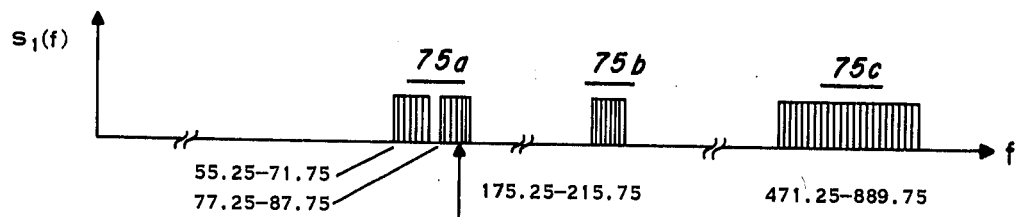
FIGS. 2a–2e are a series of frequency diagrams illustrating signals at selected points on the channel selector of FIG. 1.
Figure 2B:
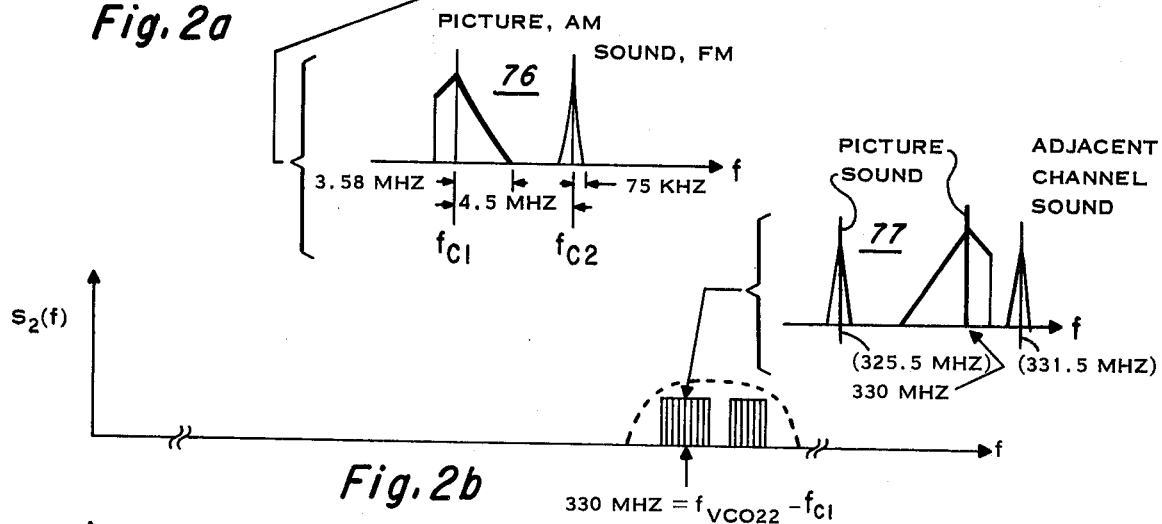

Referring now to FIGS. 2a–2e, there is illustrated a set of frequency diagrams of signals $S_1(f)$–$S_5(f)$. In FIG. 2a, the low VHF band is shown generally at 75a, the high VHF band is shown generally at 75b, and the UHF band is shown at 75c. Each of the bands is comprised of a plurality of channels; and each channel has a frequency spectrum which is assigned as illustrated in detail at 76. The frequency allocation and type of modulation of signals within each channel is a well known standard that is fixed by the FCC. FIG. 2b is an exemplary frequency diagram of signal $S_2(f)$. In the example illustrated, signal $S_2(f)$ contains channels in the low VHF spectrum. The selected channel is near 330 MHZ. The frequency of the LO signal on lead 23 minus the frequency of the picture carrier from the selected channel equals 330 MHZ. Since the mixing frequency is higher than the picture carrier, the frequency spectrum at the output of mixer 20 is inverted from the input frequency spectrum as shown at 77.

Figure 2C:
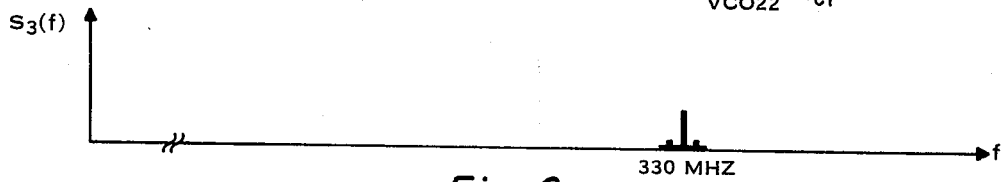
Figure 2D:
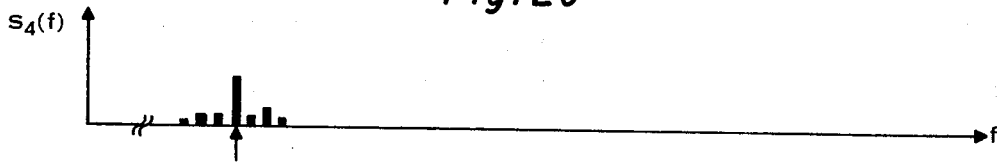

FIG. 2c illustrates the frequency spectrum of signal $S_3(f)$. Signal $S_3(f)$ is the output of the channel selecting filter 28. Thus it basically contains only frequencies within the selected channel. Signal $S_3(f)$ is then amplified and frequency shifted down by 285 MHZ. The result is signal $S_4(f)$ as illustrated in FIG. 2d.

Figure 2E:
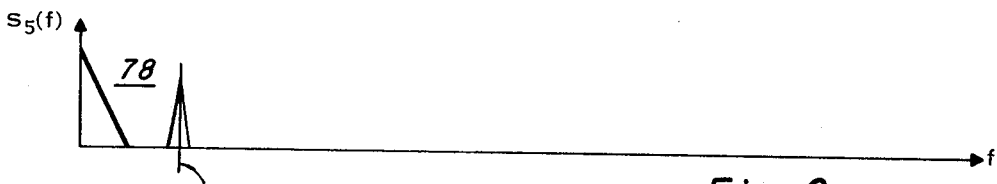

Signal $S_4(f)$ is further amplified, and then synchronously detected by detector 42. These operations produce signal S5(f) as illustrated in FIG. 2e. Note that the mixing action of synchronous detector 42 again inverts the frequency spectrum of the selected channel. Thus, the picture carrier of the selected channel is at 0 HZ, and the sound carrier of the selected channel is at 4.5 MHZ as shown at 78.

Figure 3:
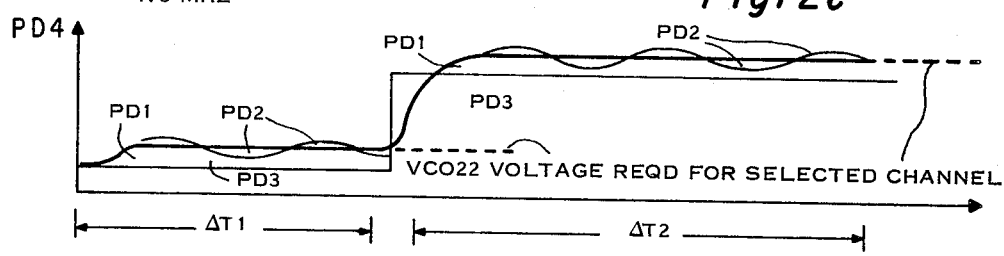
FIG. 3 is a timing diagram illustrating the operation of a phase locked loop within the channel selector of FIG. 1.

FIG. 3 is a timing diagram illustrating the operation of the channel selecting phase locked loop of FIG. 1. As shown therein, signal PD4 on lead 58 is comprised of components PD1-PD3. Signal PD3 constitutes a coarse channel selection voltage which is produced by controller 52. Signals PD2 and PD1 provide the fine tuning for the phase locked loop. In the example of FIG. 3, one particular channel is selected during the first time interval $\Delta T1$, while another channel is selected during a time interval $\Delta T2$. Signal PD3 provides the coarse voltage for channel selection. Signal PD1 compensates for any DC offset between signal PD3 and the desired voltage level, and signal PD2 provides a dynamic correction voltage to compensate for instantaneous phase or frequency differences between the signals on leads 40 and 44.

The magnitude of the signals of FIGS. 2a-2e are illustrated in FIGS. 4a and 4b. FIG. 4a illustrates the magnitude of signals in the desired channel, whereas FIG. 4b illustrates the magnitude of interfering signals in a channel that is two channels removed. Curves 81-84 illustrate the magnitude of signals in the desired channel at various points in the system when the incoming signal strength is 0 dBM, −35 dBM, −55 dBM, and −85 dBM respectively. As these curves illustrate, gain is first added by amplifier 38, then by amplifier 29, and finally by amplifier 17 as the input signal strength in the selected channel decreases. In particular, the RF section has no gain unless the input signal strength in the selected channel is less than −55 dBm. And the RF section reaches its maximum gain of +3 dBm when the input signal strength of the selected channel is between −55 dBm and −85 dBm.

As previously pointed out, the low gain RF section in combination with the MESFET RF amplifiers and MESFET RF mixer provides a system having superior channel discrimation capability. This is exemplified in FIG. 4b by the relative signal strength of the selected and unselected channels. For example, curve 85 of FIG. 4b illustrates the case where the input signal strength of the selected channel is −55 dBm and input signal strength two channels removed is +1 dBm. Similarly, curve 86 illustrates the case where the input signal strength in the selected channel is −35 dBm and the input signal strength two channels removed is +2 dBm. The most stringent requirement for the receiver is when the first RF amplifier requires gain (i.e., when the signal strength of the desired channel is less than −55 dBm). This is because the added gain increases nonlinearities in the RF section and aggravates the cross modulation and intermodulation distortion. Thus, curve 85 illustrates the most stringent condition for the system. Under the conditions of curve 85, RF amplifier 17 and mixer 20 must have cross modulation distortion and intermodulation distortion of less than 1%. This requirement is met, since the MESFET designs herein described have less than 1% cross modulation distortion and intermodulation distortion when their output signal level is less than +6 dBm.

After the selected channel has been shifted to 330 MHZ, signals two channels removed from the selected channel are greatly attenuated. Mixer 20 has a tuned output which attenuates two channel removed signals by −4 DB. SWD filter 28 attenuates all out of band signals by at least −53 DB. At the same time, mixer 20 adds 4 DB of gain to the desired signal, and filter 28 inserts only 3.5 DB of loss to signals in the selected channel.

Figure 5A:
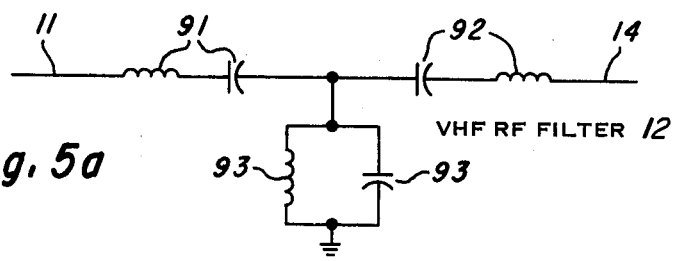
FIGS. 5a, 5b and 5c are detailed circuit diagrams of RF filters within the channel selector of FIG. 1.

The details of the various blocks of FIG. 1 will now be described in conjunction with FIGS. 5-19. Referring first to FIG. 5a, a circuit diagram of bandpass filter 12 is therein illustrated. Basically, filter 12 is comprised of two series resonant LC circuits 91 and 92 and one parallel resonant LC circuit 93. Filter 13 is similarly structured.

A primary function of RF filters 12 and 13 is to pass one band of channels while rejecting image frequencies by an amount sufficient to eliminate perceptible picture interference. Since this system uses a 330 MHZ IF, all image frequencies are 660 MHZ above the frequency of the desired channel. Thus, the low VHF images are rejected by the three pole bandpass filter of FIG. 5a by greater than 80 DB. In the system of FIG. 1, just perceptible picture interference occurs when image frequency signals are less than 36 DB below the level of the desired signal at the filter output. Thus, for example, the filter of FIG. 5a provides adequate image frequency rejection when the desired picture signal level is at −55 DBM and the image frequency level is at −11 DBM. Image frequencies for the low VHF and the high VHF spectrum lie within the UHF spectrum, and the level of UHF signal at the input of the VHF antenna can normally be expected to be less than −11 DBM.

Figure 5B:
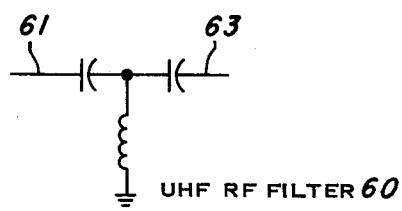
Figure 5C:
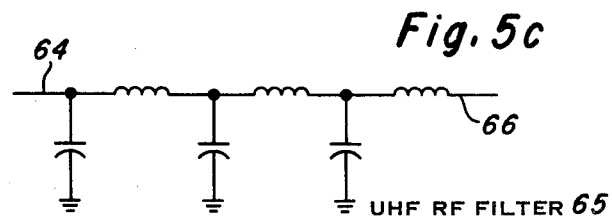

FIGS. 5b and 5c are circuit diagrams of a high pass filter and a low pass filter suitable for use by the UHF radio frequency section of FIG. 1. All of the UHF images fall outside of the TV band. The first image falls at approximately 1130 MHZ and the last image falls at approximately 1545 MHZ. These frequencies are allocated for aircraft navigation, with the TACAN system having the highest power output. But TACAN power output is only 5 KW with a $1.8 \times 10^{-3}$ to 1 duty cycle. And thus the TACAN signal is 50 DB lower than that transmitted by a 1 MW TV transmitter. Therefore, the filters of FIGS. 5b and 5c provide adequate rejection of image signals for the UHF band.

Figure 6:
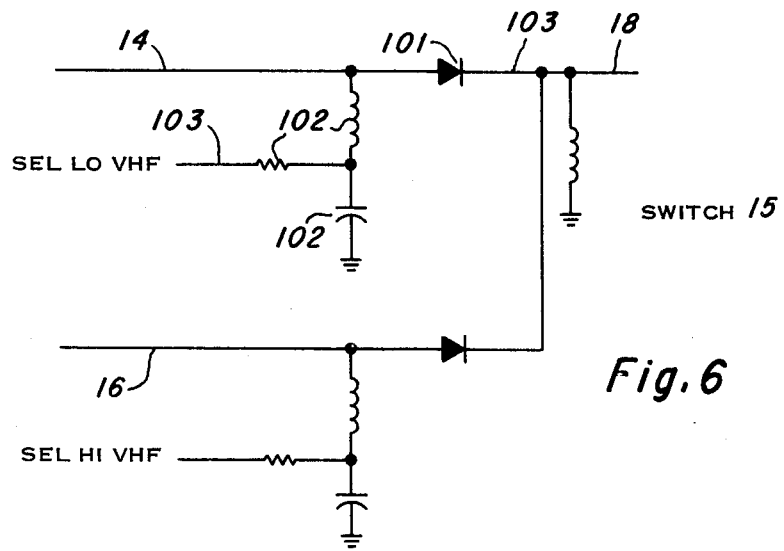
FIG. 6 is a detailed circuit diagram of a two-by-one switch within the channel selector of FIG. 1.

FIG. 6 is a detailed circuit diagram of switch 15. One portion is basically comprised of a diode 101 connecting leads 14 and 18, and an RLC bias network 102 having a control input 103. A DC voltage control signal SEL-LOVHF is applied to lead 103 for selectively turning diode 101 on or off to thereby select or deselect the low VHF signals on lead 14. Another portion identical to the one described above couples lead 18 to lead 16, and is utilized to select and deselect the high VHF chanels.

Figure 7:
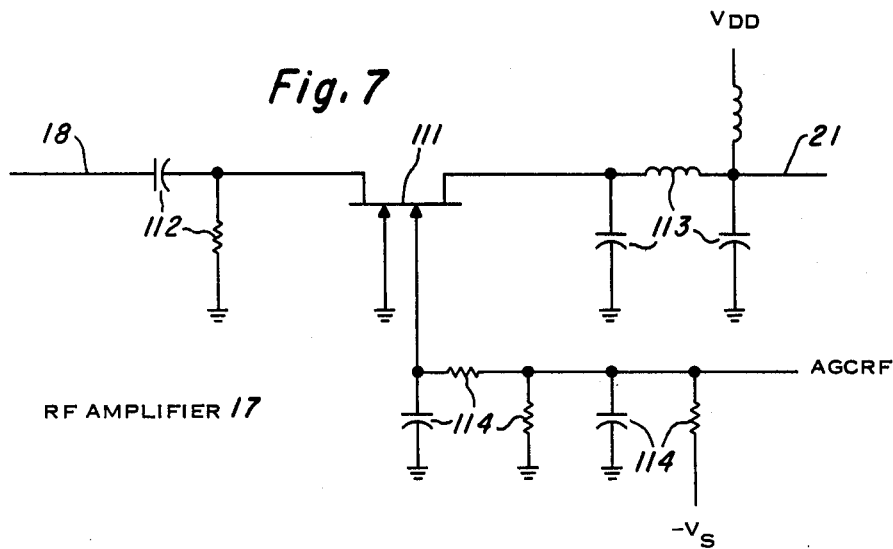
FIG. 7 is a detailed circuit diagram of an RF amplifier within the channel selector of FIG. 1.
Figure 8:
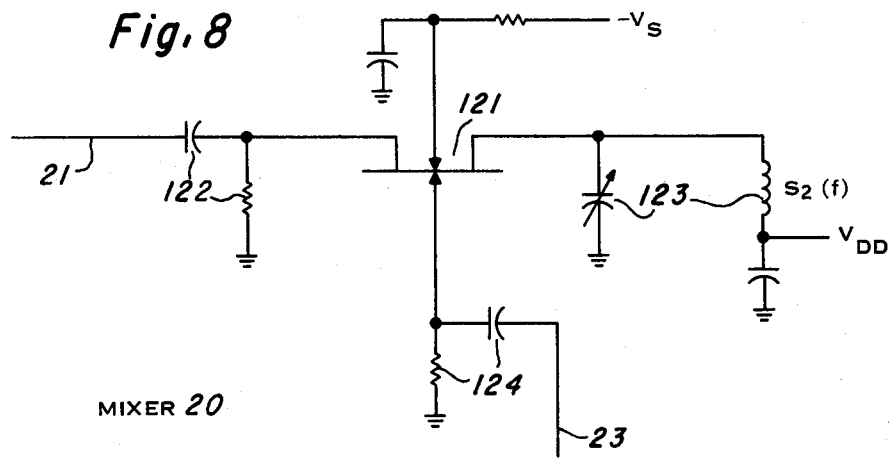
FIG. 8 is a detailed circuit diagram of a MESFET mixer within the channel selector of FIG. 1.

Referring next to FIGS. 7 and 8, there is illustrated a detailed circuit diagram of RF amplifier 17 and mixer 20, respectively. Basically, amplifier 17 is comprised of a dual gate MESFET transistor 111 having a source coupled to a bias resistor and coupling capacitor 112, and a drain coupled to an L-C bandpass circuit 113. The gain of transistor 111 is varied about the levels indicated in FIG. 4a by an automatic gain control signal AGCRF. Signal AGCRF couples to a gate of transistor 111 through a voltage dividing network 114.

Similarly, mixer 20 is comprised of a single gate MESFET transistor 121 having a source coupled to a bias resistor and coupling capacitor 122, and a drain coupled to an L-C bandpass circuit 123. Circuit 123 has a center frequency of 330 MHZ. The mixing signals from VHF VCO 22 are coupled to the gate of transistor 121 via an RC circuit 124.

It should be emphasized that the Schottky barrier gate structure of the MESFET transistors of amplifier 17 and mixer 20 yield significant performance improvements over other known devices. Narrow gate depletion mode MOSFET devices have a high frequency response, but they approximate square-law transfer characteristics over only a very narrow range of gate bias. Since departure from square-law operation results in cross modulation and intermodulation distortion, the devices are restricted to a small dynamic range. In comparison, the MESFET devices 111 and 121 have nearly ideal square-law characteristics over the entire operating range indicated in FIG. 4a. JFET devices also have a good square-law transfer characteristic, but their high frequency performance is greatly reduced because of parasitic capacitance and process difficulties that limit their usable geometries.

Figure 9A:
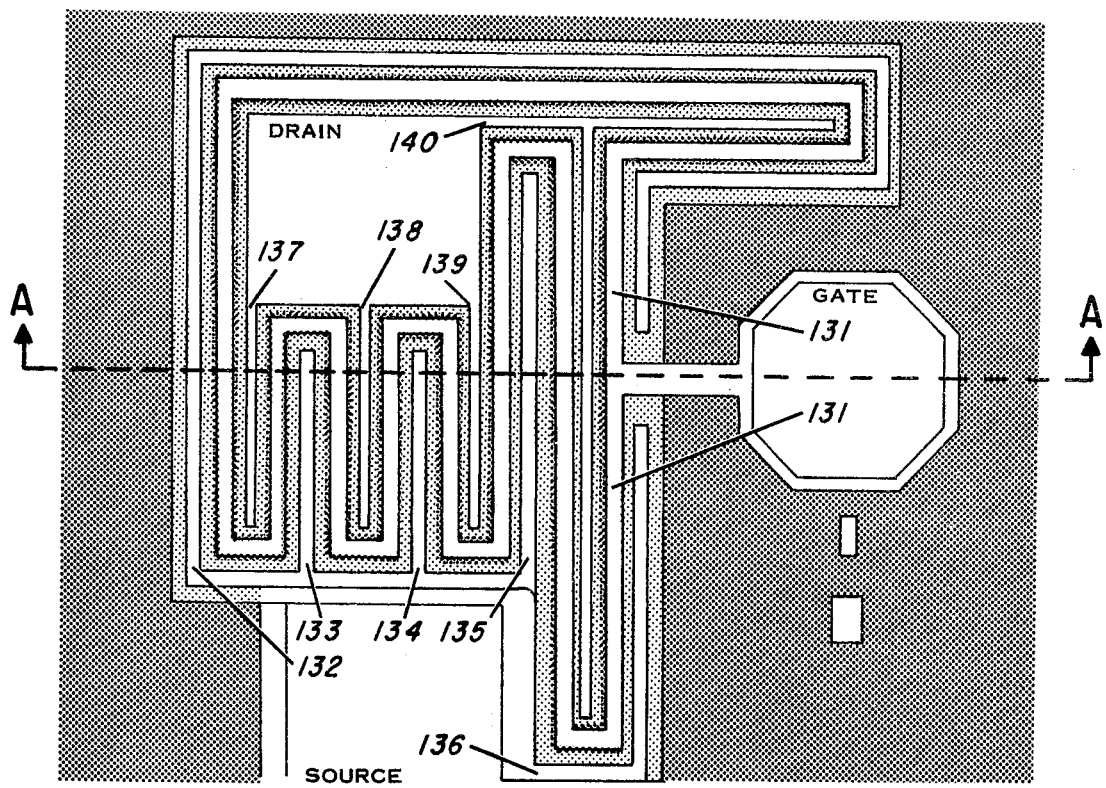
FIG. 9a is a plan view of a MESFET transistor suitable for application in the MESFET mixer of FIG. 8.

Referring now to FIG. 9a, there is illustrated a completed MESFET device suitable for use as mixer 20. The MESFET of FIG. 9a has a closed gate 131. Gate 131 is approximately 80 mils in length. The gate metal is approximately 0.3 mils wide, while the Schottky barrier gate in contact with the gate metal is approximately 0.15 mils wide. The source consists of five fingers 132–136 having lengths of 32.7 mils, 4.1 mils, 4.1 mils, 7.7 mils and 12.1 mils respectively. The width of these fingers is approximately 0.3 mils. The drain consists of fingers 137–140.

Figure 9B:
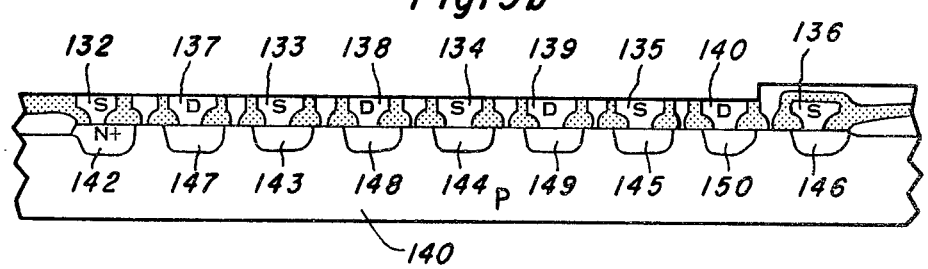

FIG. 9b is an enlarged cross-sectional view taken along the line A—A of FIG. 9a. The MESFET is constructed on a silicon substrate 140 having a P-type impurity. The resistivity of substrate 140 is approximately 50 ohm-centimeters. Each of the source electrodes 132–136 couples to an N+ doped region 142–146 respectively. These doped regions have a resistivity of approximately 0.005 ohm-centimeters. The doped regions extend beyond their corresponding electrodes by approximately 0.3 L mils and are separated from the spaced apart gate electrode by approximately 0.15 mils. Similarly, the metal electrodes 137–140 which form the drain electrodes are coupled to underlying N+ doped regions 147–150, respectively. The resistivity and geometry of the drain doped regions are similar to that of the source doped regions.

Figure 9C:
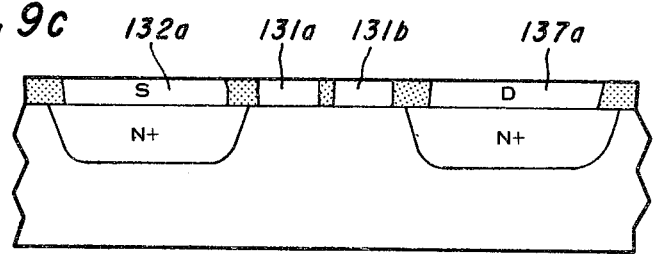
FIG. 9c is a greatly enlarged cross-sectional view of a dual gate MESFET device showing one source-drain pair thereof and which comprises another MESFET transistor suitable for application in the MESFET amplifier of FIG. 7.

FIG. 9c is a greatly enlarged cross sectional view of one source drain pair within a dual gate MESFET device suitable for use with amplifier 17. The entire device is constructed similar to that of FIG. 9a, with the modification that two gates are interleaved between the source and drain electrodes. In FIG. 9c, source electrode 132a and drain electrode 137a correspond to electrodes 132 and 137 of FIG. 9a. Gate electrodes 131a and 131b occupy the space of electrode 131 in FIG. 9a.

Figure 9D:
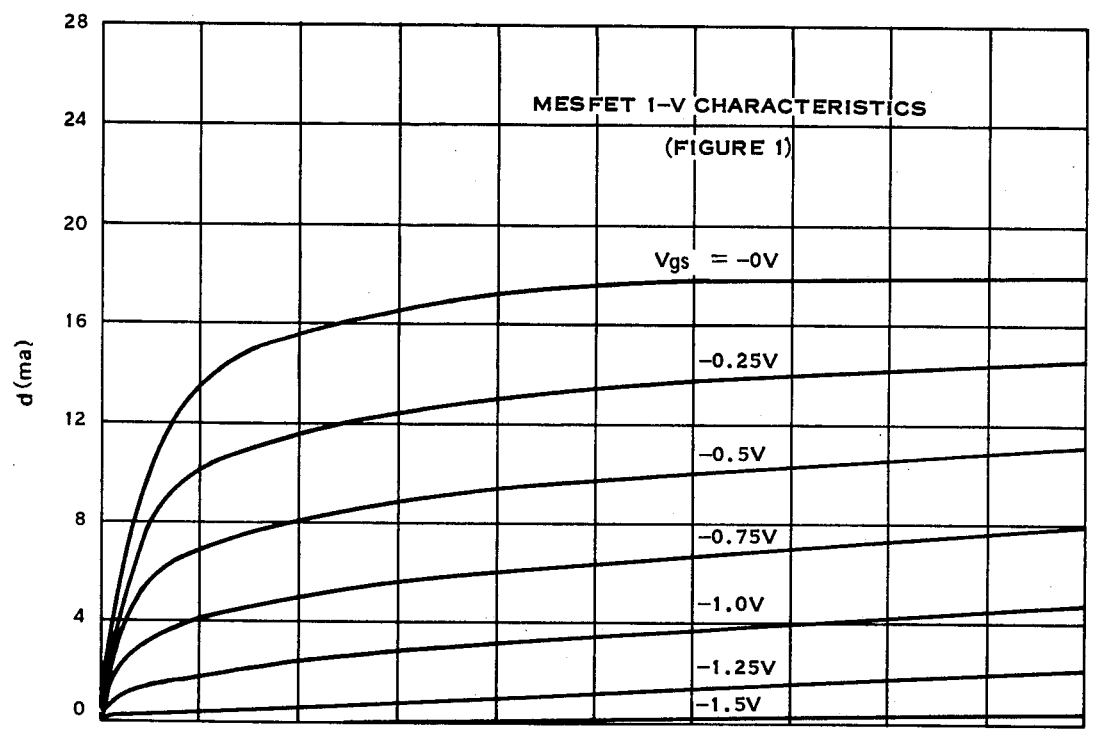
Figure 9E:
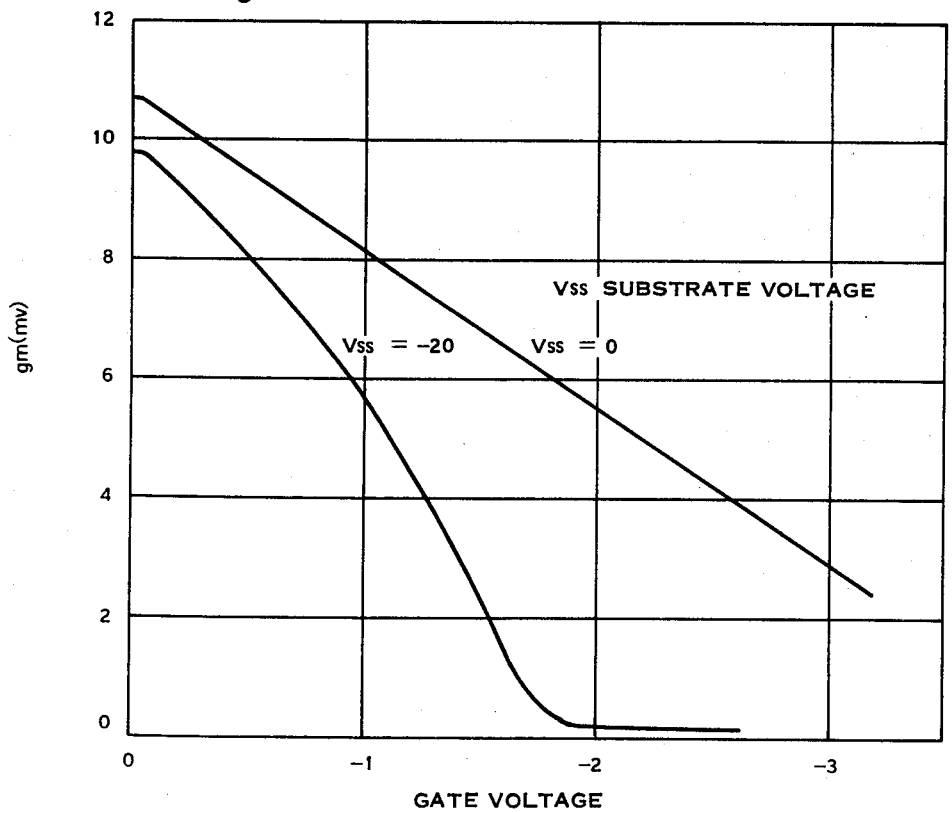

FIG. 9d illustrates the I-V characteristics of the devices of FIG. 9a, while FIG. 9e illustrates their transconductance as a function of gate voltage. In an ideal square-law device, the drain current is proportional to the square of the gate voltage. And since transconductance equals the partial derivative of drain current with respect to gate voltage, the transconductance is directly proportional to gate voltage for ideal square-law operation. FIG. 9e demonstrates such a linear relation between the transconductance and gate voltage for the MESFET device of FIG. 9a.

Figure 10:
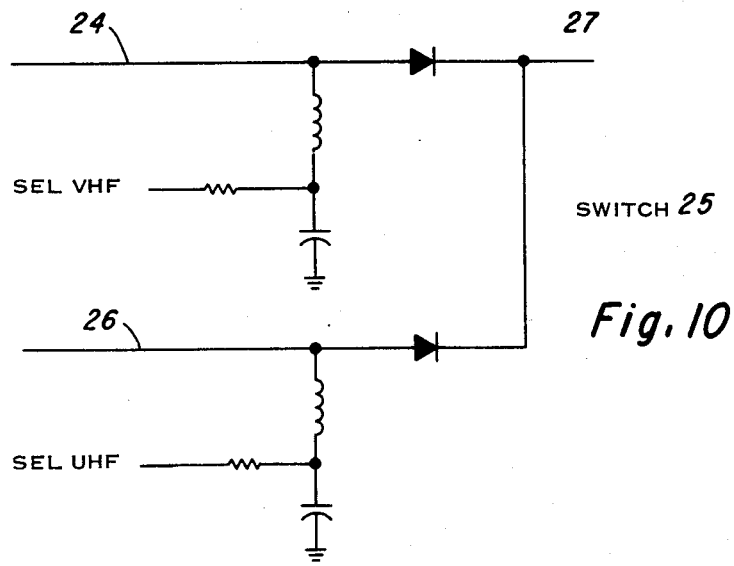
FIG. 10 is a circuit diagram of a second two-by-one switch within the channel selector of FIG. 1.

Referring now to FIG. 10, a circuit diagram of switch 25 is illustrated. Switch 25 is constructed identical to the previously described switch 15 of FIG. 6. The signals on leads 24 and 26 are selectively coupled to the output lead 27 via DC control signals select VHF (SELVHF) and select UHF (SELUHF) respectively.

Figure 11C:
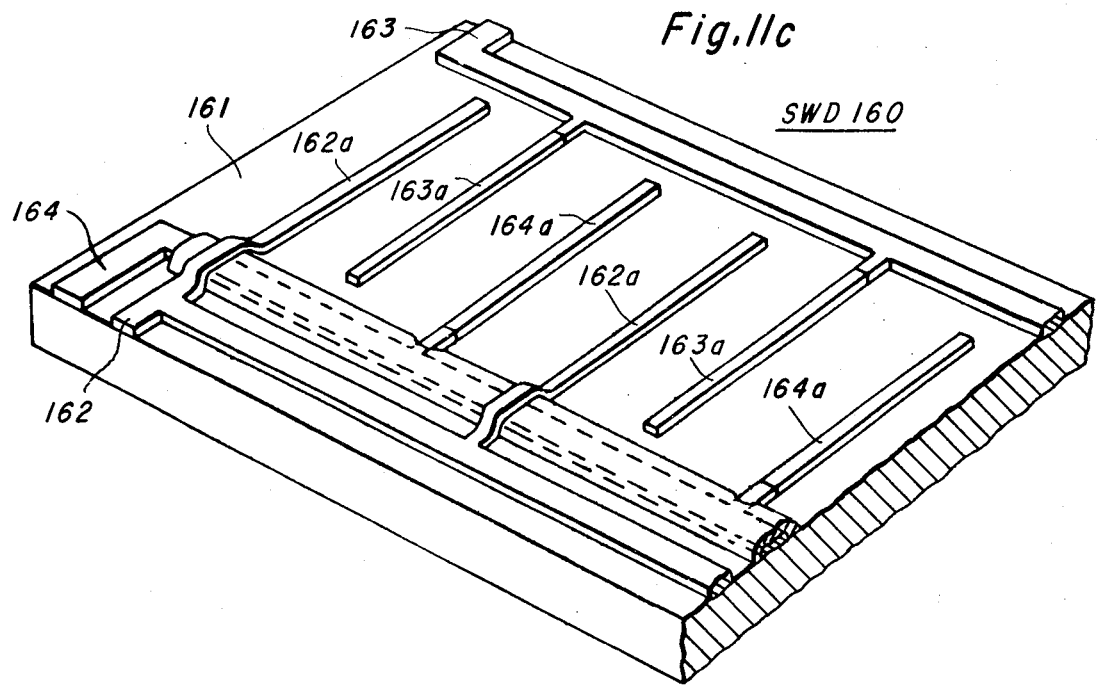

FIGS. 11a–11h illustrate the details of SWD filter 28. Filter 28 is comprised of a surface wave device chip 160 having an L-C input circuit 170, and an L-C output circuit 190 for impedance matching and phase shifting signals to and from SWD device 160. Leads 172–174 and 192–194 couple circuits 170 and 190 to SWD 160 as illustrated in FIG. 11a.

Device 160 has a magnitude-frequency characteristic as illustrated in FIG. 11b. In particular, device 160 attenuates signals which are 1.5 MHZ above the picture carrier of the desired channel by at least 65 db. At that frequency, the sound carrier of the channel adjacent to the desired channel is present. It is important to greatly attenuate this sound carrier because it is translated into the video signals of the selected channel by synchronous detector 42. That is, the sound carrier at 46.5 MHZ is translated to 1.5 MHZ by detector 42. In the receiver of FIG. 1, just perceptable picture interference occurs when the sound carrier at 46.5 MHZ is passed through SWD filter 28 with a magnitude that is within 36 dB of the picture carrier at 45 MHZ. Thus, SWD filter 28 with its greater than 65 dB adjacent channel rejection enables the receiver of FIG. 1 to have good picture reception even though signals at the filter input in an adjacent channel are much larger than signals in the desired channel. For example, if the signal level of the desired channel is −55 DBM at the input of filter 28, then the 46.5 MHZ sound carrier at the input of filter 28 can be as high as −26 dBm and the receiver of FIG. 1 will meet the requirement of a −36 dB difference between the in band and out band signals at the output of filter 28. By comparison, prior art television receivers typically have perceptable picture interference when the adjacent channel sound carrier is −40 dBm.

Figure 11D:
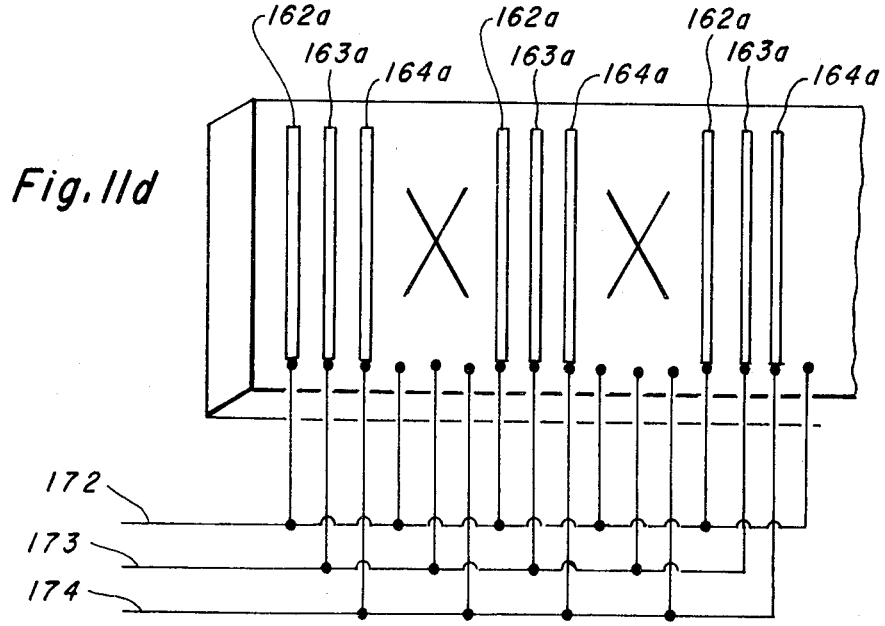
FIG. 11d is a partially perspective, diagrammatic view illustrating the surface wave device included in the filter of FIG. 11a wherein the impulse response of the surface wave device has been shaped by electrode finger withdrawal.

FIGS. 11c and 11d illustrate the physical structure of one embodiment of SWD 160. Basically, device 160 is comprised of a piezoelectric substrate 161 which in a preferred embodiment is made of quartz. Quartz has a desirable feature in that the velocity of surface waves through quartz is practically independent of temperature. The dependence of velocity on temperature is of considerable importance since velocity effects the center frequency of the filter as described below.

Three electrically independent conductors 162–164 are disposed on substrate 161. Each conductor has corresponding finger electrodes 162a–164a which are disposed on substrate 161 in a comb like fashion. Fingers 162a–164a are equally spaced. The distance between two consecutive fingers on the same conductor is one wavelength of the center frequency of the filter. The velocity of a surface wave in quartz is approximately 3,300 meters per second, and the center frequency of device 160 is approximately 330 MHZ. Thus, the distance between two consecutive 162a fingers for example is approximately $10 \times 10^{-6}$ meters.

Conductors 162–164 are coupled to the input circuitry 170 of FIG. 11a via leads 172–174 respectively. Input circuitry 170 generates voltages on electrodes 162–164 which are 120° out of phase with each other. This phase relationship generates a unidirectional surface wave on substrate 161. That is, waves in the forward direction add constructively, while waves in the reverse direction add destructively. As a result, device 160 has a low insertion loss for signals in the passband.

In particular, the loss through filter 160 is no more than 3.5 DB. U.S. Pat. No. 3,686,518 issued Aug. 22, 1972 to Hartmann et al and assigned to Texas Instruments Incorporated includes additional structural details of unidirectional surface wave filter 160.

FIG. 11d illustrates a method for shaping the impulse response of surface wave filter 160. The method therein illustrated in known as the finger withdrawal method. It involved removal of groups of fingers from selected portions of substrate 161. Basically, the amplitude of the impulse response in those regions from which the fingers are removed is reduced below the value which it would have if the fingers had not been removed. The method thus provides the capability to control the relative amplitude of the impulse response along the length of substrate 161. The desired impulse response is obtained by taking the inverse Fourier transfer of the frequency response of FIG. 11b; and then fingers 162a–164a are selectively removed in accordance with the desired impulse response. Further details of the finger withdrawal method are contained in U.S. Pat. No. 3,946,342 issued Mar. 23, 1976 to Hartmann and assigned to Texas Instruments Incorporated.

Figure 11E:
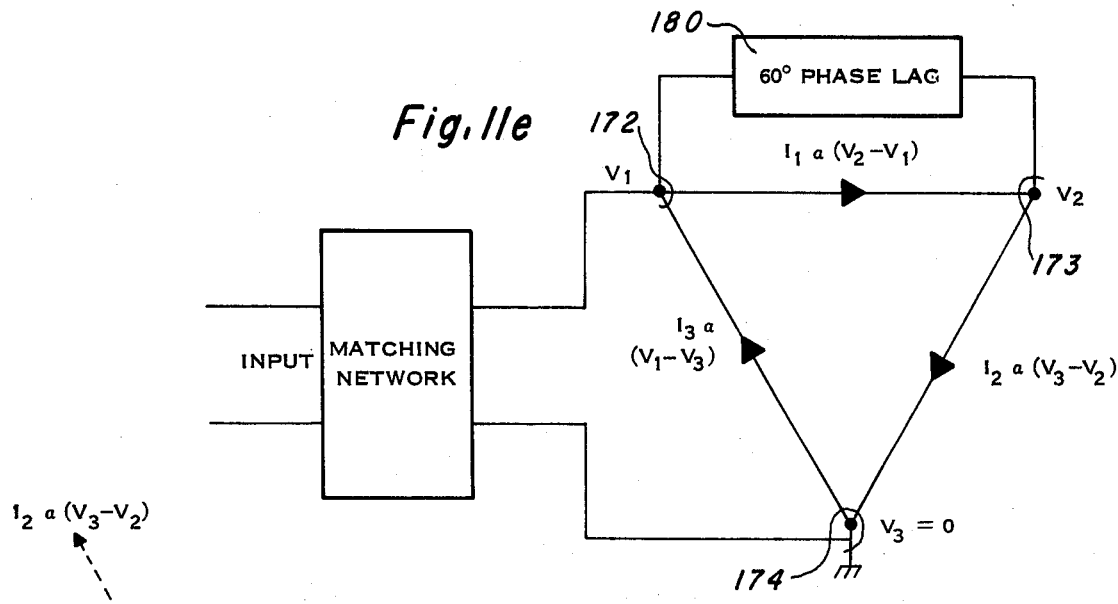
Figure 11F:
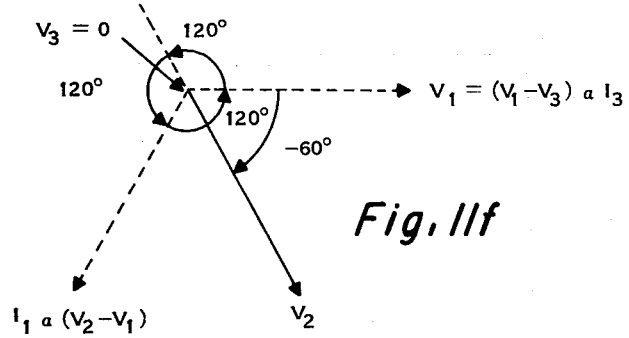
FIG. 11f is a phase diagram illustrating how the phase shifting circuit of FIG. 11e can produce a 120° phase shift.

FIGS. 11e–11h illustrate a method for determining the value of inductors 175–177 and capacitor 178 comprising input circuitry 170. As was previously described, one of the functions of circuit 170 is to generate voltages on leads 172–174 which are shifted in phase from each other by 120°. FIG. 11e illustrates that this 120° phase shift can be achieved by a circuit 180 which produces a 60° phase lag between the voltage on lead 172 and the voltage on lead 173, in combination with a grounding of lead 174. This point is further illustrated by the phase diagram of FIG. 11f.

Figure 11G:
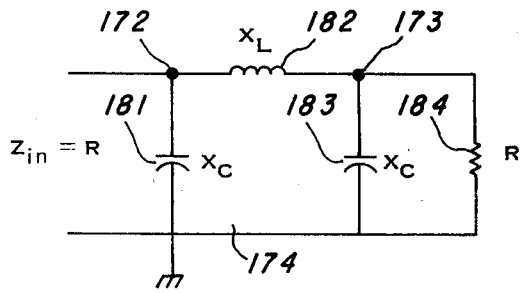
FIG. 11g is a diagram of a circuit for producing a 60° phase lag.

A circuit for producing a 60° phase lag is illustrated in FIG. 11g. The circuit consists of a pi shaped R-L-C network consisting of a capacitor 181, and inductor 182, a capacitor 183, and a resistor 184. Included in FIG. 11g are two equations relating the angle of phase lag between leads 172 and 173 in terms of components 181–184. In the case at hand, the angle of phase is 60°, and resistor 184 is the resistance between the electrodes 162 and 163 divided by 2. Thus, utilizing the equations of FIG. 11g, values for $|X_l|$ and $|X_c|$ can be calculated.

Figure 11H:
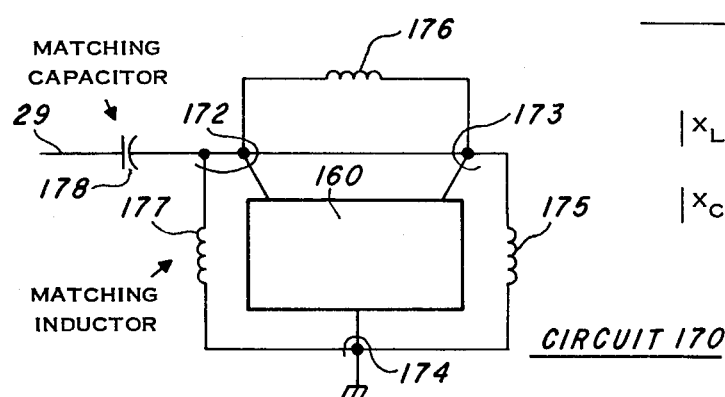

Impedance 183 is physically implemented by coupling inductor 175 across leads 173 and 174; and impedance 182 is physically implemented by coupling inductor 176 across leads 172 and 173 as illustrated in FIG. 11h. The parallel combination of inductor 175 and the capacitance between leads 173 and 174 due to the SWD electrodes is chosen to equal impedance 183. Similarly, the parallel combination of inductor 176 and the capacitance across leads 172 and 173 due to the SWD electrodes is chosen to equal impedance 182. Inductor 175 may typically equal 30 nanohenries, while inductor 176 may typically equal 35 nanohenries as an example.

Inductor 177 is then added between leads 172 and 174 while capacitor 178 is added between leads 172 and 29 so as to match the impedance between leads 172 and 174. Typically, inductor 177 is approximately 25 nanohenries, and capacitor 178 is 10 picofarads.

To this point, the discussion with reference to FIGS. 11a–11h has concentrated primarily on the structure of input circuitry 170 and the input transducer of SWD device 160. It will be understood however, that surface wave device 160 also has an output transducer on substrate 161 of a construction similar to that of the input transducer. Also, output circuitry 190 of FIG. 11a is constructed similar to input circuitry 170.

Figure 12A:
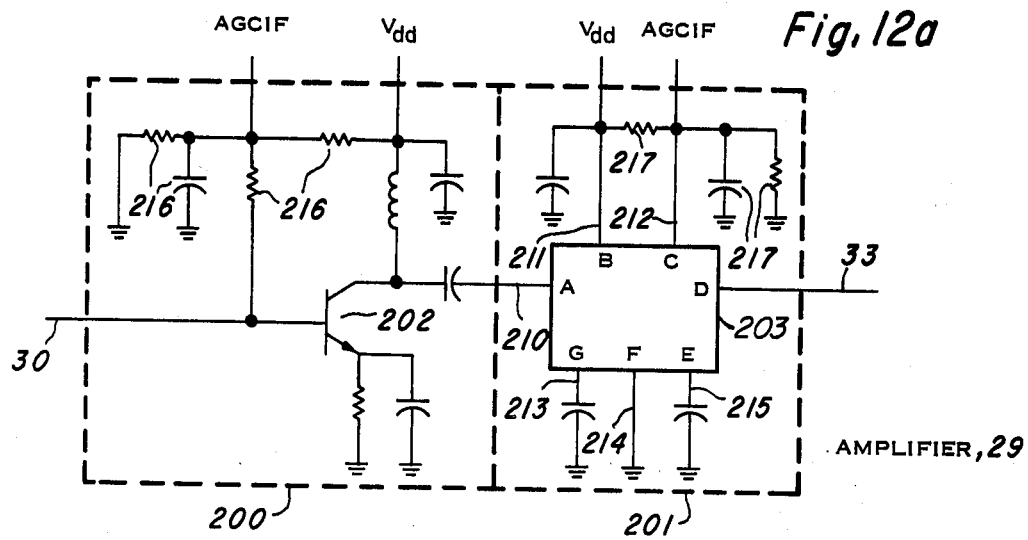
FIGS. 12a–12b are detailed circuit diagrams of a linear amplifier within the channel selector of FIG. 1.
Figure 12B:
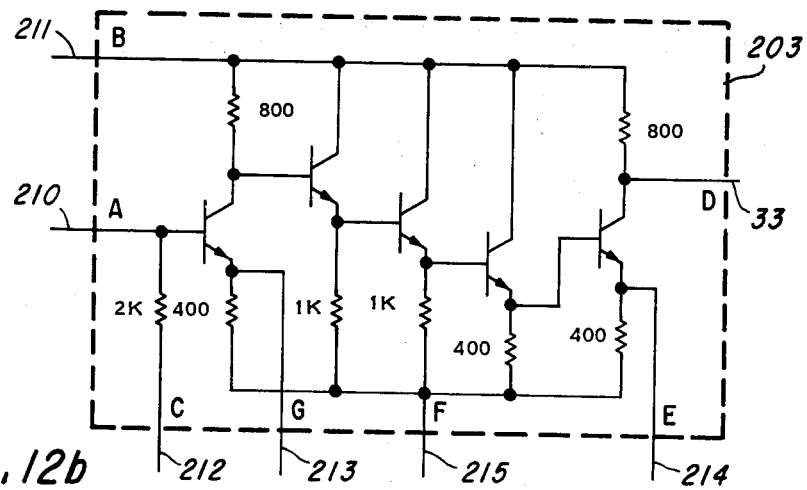

Referring next to FIGS. 12a and 12b, a circuit diagram of RF amplifier 29 is therein illustrated. Amplifier 29 is comprised of stages 200 and 201. Stage 200 includes a single bipolar transistor 202 as its amplifying element, whereas stage 201 includes several DC coupled bipolar transistors in an integrated circuit 203 as its amplifying element. Circuit 203 is indicated in FIG. 12a as a single circuit element, and is shown in detail in FIG. 12b.

Amplifier 29 provides a maximum gain of 30 DB to signals on its input lead 30. A small portion of the gain is provided by stage 200 which has a relatively good noise figure, whereas the remainder of the gain is provided by stage 201. AGC control signal AGCIF couples to stages 200 and 201 as indicated in FIG. 12a through bias circuits 216 and 217. The magnitude of signal AGCIF varies so as to keep the output of amplifier 29 at approximately −26.5 DBM. The variation of gain versus input signal strength for amplifier 29 was previously indicated in FIG. 4a.

Figure 13:
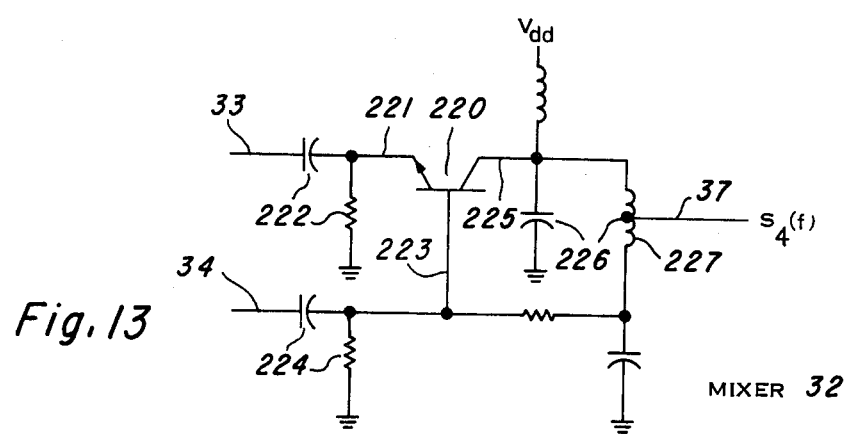
FIG. 13 is a detailed circuit diagram of a mixer within the channel selector of FIG. 1.

The output of amplifier 29 couples to mixer 32 which is illustrated in the circuit diagram of FIG. 13. The basic mixing circuit element utilized therein is a bipolar transistor 220. Transistor 220 has an emitter 221 which is coupled to the output of amplifier 29. Similarly, transistor 220 has a base 223 which is coupled to SWD oscillator 35. Oscillator 35 generates mixing signals of 285 MHZ on the base 223 of transistor 220. As a result, sum and difference frequencies are generated on the collector 225 of transistor 220. Collector 225 is coupled to an LC tank circuit 226 having a resonant frequency of about 45 MHZ. The output of tank circuit 226 is coupled via a tapped transformer 227 to lead 37 and signals $S_4(f)$ are generated thereon.

Figure 14A:
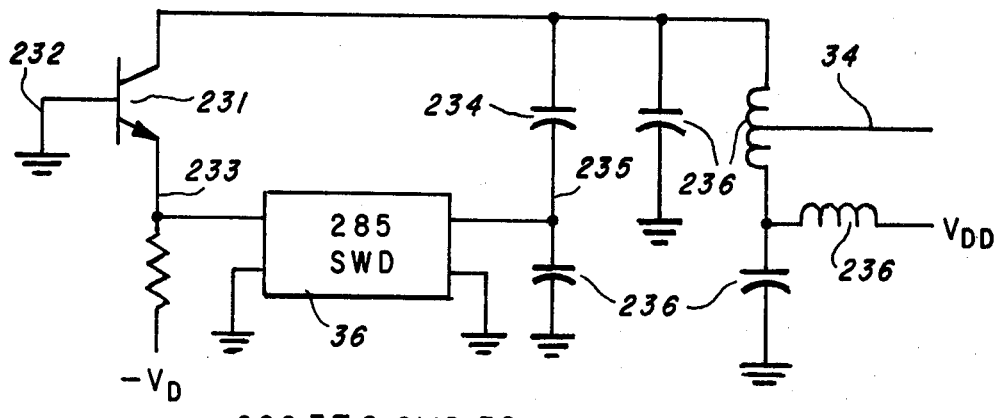
FIG. 14a is a detailed circuit diagram of a surface wave device oscillator within the channel selector of FIG. 1.
Figure 14B:
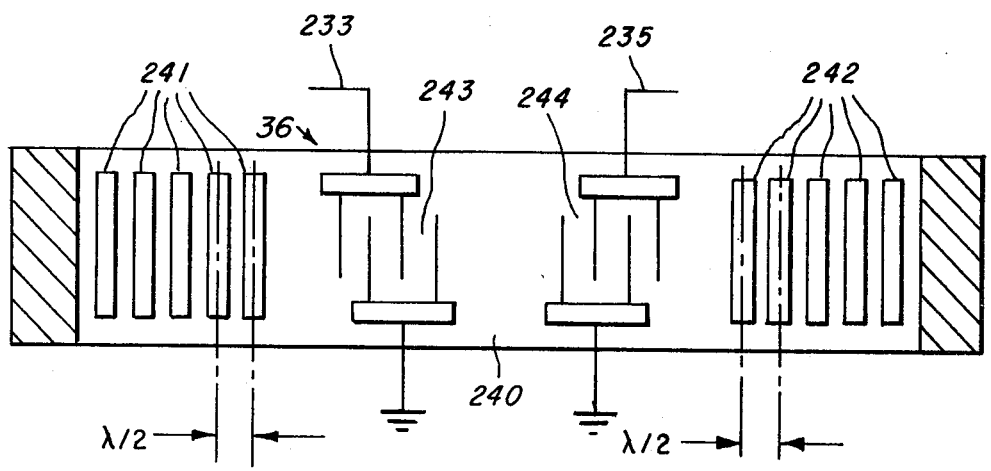

Referring next to FIGS. 14a and 14b, a circuit diagram of oscillator 35 and a schematic diagram of acoustic surface wave resonator 36 are illustrated. Oscillator 35 includes a bipolar transistor 231 as the amplifying element. Transistor 231 has a grounded base 232, an emitter coupled via lead 233 to the input of resonator 36, and a collector coupled through a capacitor 234 to the output of resonator 36. An LC circuit 236 couples a DC supply voltage $V_{DD}$ to the collector of transistor 231 and also provides an output signal on lead 34.

Surface wave resonator 36 has a relatively high resonant frequency of 285 MHZ. Thus it is relatively small in size. Device size decreases as the resonant frequency increases. Typically, the SWD 36 of FIG. 14b is only approximately 0.10 inches in length. SWD 36 also has good long term frequency stability. This is because the resonator has a large Q. Typically, its Q is greater than 15,000. Q is the ratio of energy stored to energy dissipated per cycle within the device.

SWD resonator 36 is comprised of a piezoelectric substrate 240 which in the preferred embodiment is made of quartz. Reflective grating structures 241 and 242 are disposed at opposite ends of substrate 240. These grating structures form discontinuities in the surface of the substrate 240 which reflect surface waves thereon. Gratings 241 and 242 may be comprised of grooves, or alternatively bars of gold or copper for an example. The bars are spaced apart by one half wavelength of the resonant frequency. Typically, 250 to 400 bars are contained within each of the grating structures 241 and 242. The Q of the resonator increases as the number of bars increases. Also, as previously pointed out, the velocity of the surface waves in quartz is relatively insensitive to temperature change. Thus, the resonant frequency of resonator 36 has low temperature drift. Typically, the resonant frequency varies less than 20 KHZ over a temperature range of 0°–70° C.

An input transducer 243 and an output transducer 244 are disposed on substrate 240 in the space between grating structures 241 and 242. Lead 233 couples to input transducer 243, and lead 235 couples to output transducer 244. Transducers 243 and 244 are comprised of a number of interleaved fingers which are placed at the peaks of the resonating standing wave that is set up by reflective grating structures 241 and 242. Typically, 60 fingers are on each transducer. Further details of resonator 36 are included in U.S. Pat. No. 3,886,504 issued to Hartmann et al on May 27, 1975 and assigned to Texas Instruments Incorporated.

Figure 15:
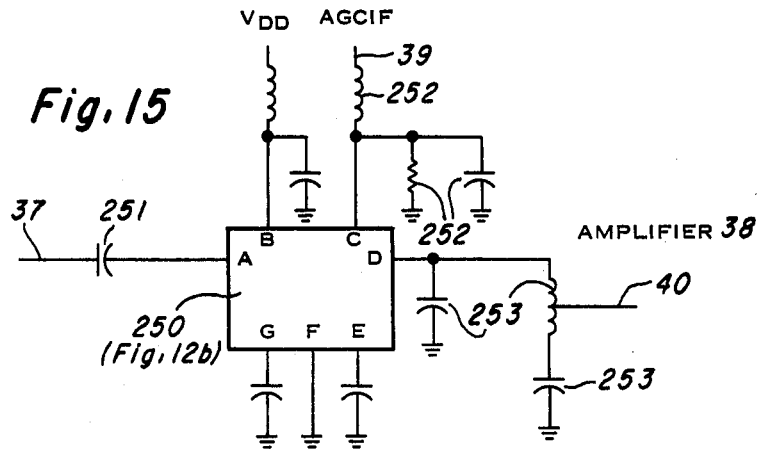
FIG. 15 is a detailed circuit diagram of a high gain linear amplifier within the channel selector of FIG. 1.

FIG. 15 is a circuit diagram of amplifier 38. Amplifier 38 is basically comprised of a circuit 250 which was previously illustrated in detail in FIG. 12b. Nodes A–G of circuit 250 as illustrated in FIG. 15 correspond to the node A–G as illustrated in FIG. 12b. Signals from mixer 32 couple to the input of circuit 250 through a capacitor 251. The gain of circuit 250 is automatically adjusted by a gain control signal AGCIF. Signal AGCIF is coupled to node C through an RLC circuit 252. The output of circuit 250 is coupled to lead 40 through an LC tank circuit 253.

Figure 16:
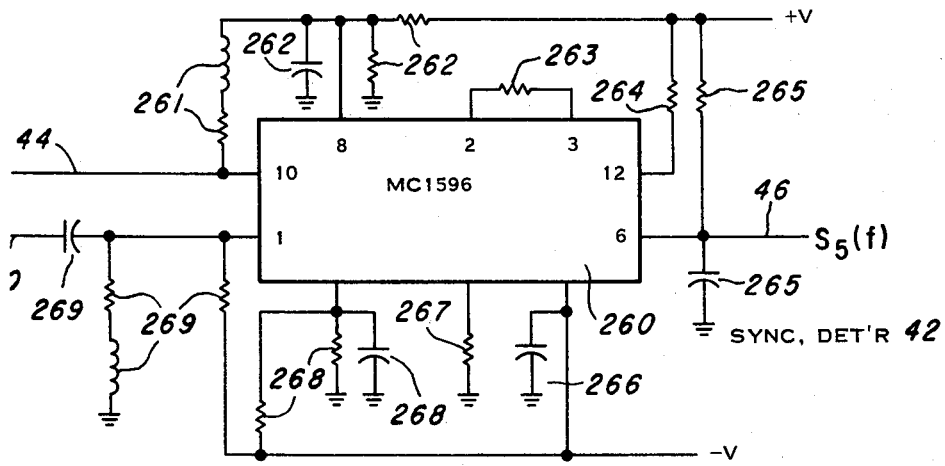
FIG. 16 is a detailed circuit diagram of a synchronous detector within the channel selector of FIG. 1.

FIGS. 16–19 are detailed circuit diagrams of the remaining portions of the channel selector of FIG. 1. The circuits utilize conventional components and are generally self-explanatory to those with ordinary skill in the art. Synchronous detector 42 is illustrated in FIG. 16. Detector 42 is essentially comprised of a commercially available chip MC1596. Chip MC1596 is described in the Linear Integrated Circuits Catalogue on pages 8-404 to 8-414 of Motorola's Semiconductor Data Library, Volume 6, Series, 1975. Details of the circuit are given on page 8-411 in FIG. 23 of the cited reference. Chip MC1596 is appropriately biased at each of its inputs and outputs by RLC circuits 261–269 as illustrated in FIG. 16. The biasing required by the component is also described in the cited reference.

Figure 17:
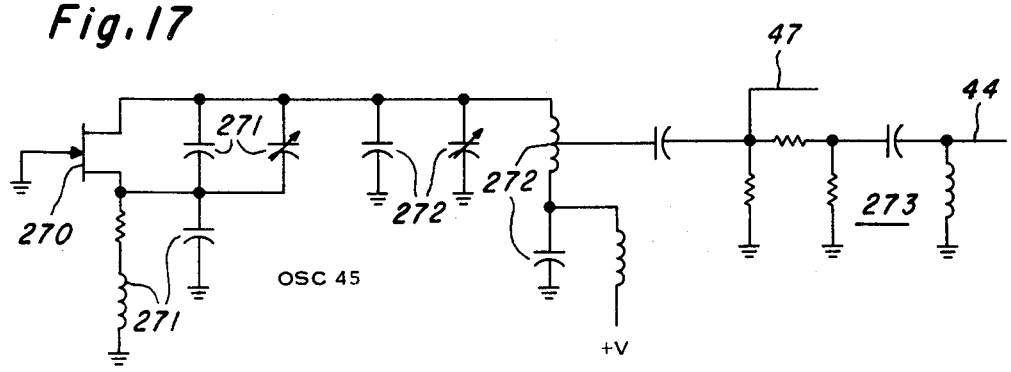
FIG. 17 is a detailed circuit diagram of a L-C oscillator within the channel selector of FIG. 1.

Oscillator 45 is illustrated in FIG. 17. Oscillator 45 has a MESFET transistor 270 as the amplifying element, and frequency determining L-C feedback networks 271 and 272. Two separate output signals are provided by oscillator 45. One of the output signals is generated on lead 47 and the other signal is generated on lead 44. Leads 44 and 47 are separated by an RLC phase shifting network 273 which generates approximately a 90° phase difference between the two signals. Phase shifting network 273 insures that the picture carrier on lead 40 is in phase with the oscillator signal on lead 44. The phase detecting circuit 43, as illustrated in FIG. 18, generates phase detection signals PD1 and PD2 which lock the oscillator signal on lead 47 90° out of phase with the picture carrier on lead 40. Circuit 273 reinserts this 90° phase shift.

The phase detector 43 of FIG. 18 also utilizes chip MC1596 as was utilized in sync detector 42. Bias networks 281–287 are applied to chip MC1596 to achieve the phase detecting function. Ramp generator 54 and loop filter 49 couple to outputs of chip MC1596 as illustrated in FIG. 18. The combination generates phase detecting signals PD1 and PD2 on leads 51.

FIG. 19 illustrates a circuit diagram of VHF-VCO 22. VHF-VCO 22 utilizes phase signals PD1 and PD2 in combination with a third signal PD3 to generate the selectable frequency L0 signals on lead 23. Signal PD3 is a multilevel analog signal which provides a coarse voltage level of a unique value for each channel to be selected. Signal PD3 is generated by controller 52 in response to manually operated channel selection switches 56 as is previously described in conjunction with FIG. 1. Signals PD1-PD3 are coupled across a varactor diode 290 through summer 50. Diode 290 in combination with capacitors 291 and a micro strip 292 form the frequency determining circuit of VHF-VCO 22. Signal amplification within VCO 22 is provided by a bipolar transistor 293. Transistor 293 is selectively enabled or disabled by a control signal "enable VHF" (ENVHF). Signal ENVHF couples to the base of transistor 293 through a resistor 294 and to the collector of transistor 293 through an inductor 295. It is selectively energized in response to the position of the channel selection switches 56.

A complete television receiver which incorporates the channel selector of FIG. 1 is illustrated in block diagram form in FIG. 20. The channel selector has input leads 11 and 61 for receiving VHF and UHF television signals as previously described. The channel selector also has input leads 53 for receiving coarse analog voltages indicating the selected channel. The RF section of the channel selector frequency shifts the selected channel to approximately 330 MHZ, while the IF section of the channel selector filters the channel at 330 MHZ and frequency shifts the filtered channel to baseband.

Lead 46 is the audio output of the channel selector. As previously described, the sound carrier of the selected channel is generated on lead 46 at 4.5 MHZ. Lead 46 is coupled to the input of an audio demodulator 301. Demodulator 301 generates signals on a lead 302 with an amplitude that is proportional to the frequency of the frequency modulated signals on lead 46. This frequency demodulation process may be implemented by a variety of circuits that are well known in the art. The demodulated signals on lead 302 couple to the input of a speaker 303 where they are electromechanically converted to audible sounds.

Lead 72 is the composite video output of the channel selector. That is, signals on lead 72 include frame synchronizing information and video information of the selected channel. Lead 72 couples to the input of a video processing unit 304. Video processor 304 separates the picture signals from the frame synchronizing signals. The picture signals are generated on a lead 305 which couples to the electron gun input of a picture tube 306. The frame synchronizing signals are generated on a lead 307 which couples to the input of a drive circuit 308. Drive circuit 308 generates horizontal and vertical synchronizing signals on a lead 309 which couples to electron beam deflection circuitry 310 of picture tube 306. Drive circuit 308 also generates horizontal synchronizing signals on a lead 311 which couples to an input of picture tube high voltage generator 312. Additionally, drive circuit 308 generates synchronizing signals on lead 73 which couples to the AGC circuitry 74 of the channel selector.

Television receiver components 301–312 have been described in detail in many prior art publications. See for example the Fundamentals of Display System Design by Sol Sherr, 1970, published by Wiley-Interscience. A bibliography on pages 445–469 of the cited reference also includes many additional references.

Figure 21:
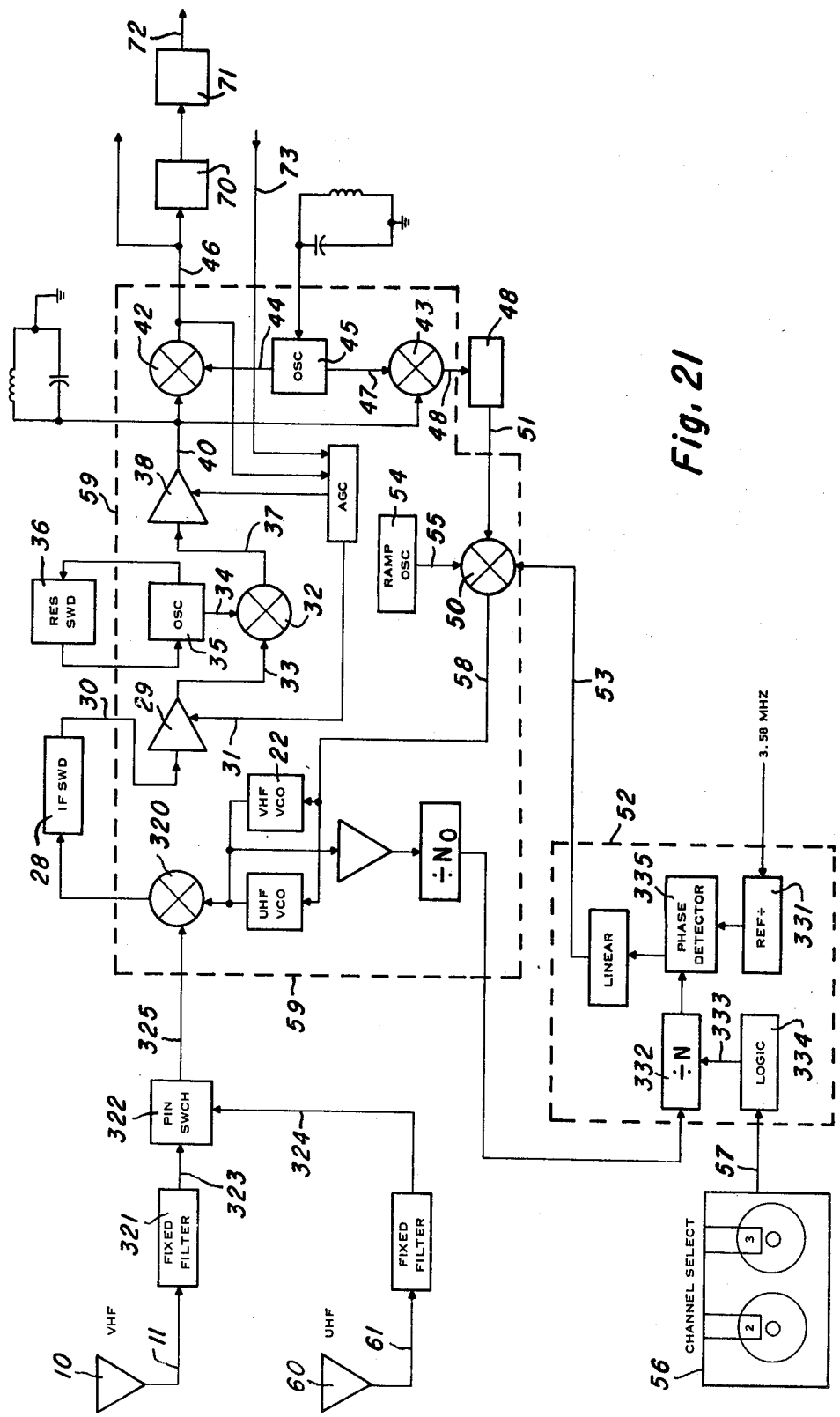
FIG. 21 is a block diagram of an alternative embodiment for the channel selector of FIG. 1.

FIG. 21 is a block diagram of a second embodiment of a channel selector constructed according to the invention. A significant portion of this second embodiment is similar in construction to that of the FIG. 1 embodiment. The similar portions are indicated by the identifying reference numerals.

One structural difference of the second embodiment is that it has only one VHF filter. That is, signals on VHF antenna 10 are coupled to a local oscillator mixer 320 through a fixed filter 321 which passes the entire VHF band of frequencies. A second difference is that the embodiment of FIG. 21 contains no RF amplifier. As a result, the system has improved intermodulation distortion and cross modulation distortion but has an increased noise figure. Still another difference is that the FIG. 21 embodiment contains only one RF MESFET mixer. A two by one switch 322 is provided having one input coupled to receive VHF signals on a lead 323 and a second input coupled to receive UHF signals on a lead 324. The output of switch 322 couples via a lead 325 to MESFET mixer 320.

The embodiment of FIG. 21 also includes a different means for generating the coarse channel selection voltages on leads 53. As FIG. 21 illustrates, controller 52 is comprised of a phase locked loop. The loop receives reference signals of a fixed frequency from a circuit 331, and simultaneously receives feedback signals from the LO VCO. The LO VCO signals are sent through a variable counter 332. Counter 332 divides by a number which is selectable via logic signals on leads 333. The signals on leads 333 are generated by a logic circuit 334 in response to logic signals received from the channel selection switches 56. A phase detector 335 compares the output signals of variable counter 332 to the reference signals, and generates phase detection signals for the LO VCO. Thus, a relatively high local oscillator frequency is generated when counter 332 is selected to divide by a relatively large number and vice versa.

Various embodiments of the invention have now been described in detail. However, many changes and modifications can be made to the above details without departing from the nature and spirit of the invention. For example, the IF frequency of the mixer output is not restricted to 330 MHZ. Other IF frequencies in the range of 300–400 MHZ may be employed. As another example, a bipolar RF amplifier may substituted for the MESFET RF amplifier. This is because the mixer introduces cross modulation distortion and intermodulation distortion into the receiver to a much smaller degree than does the linear RF amplifier. Thus, utilization of a MESFET mixer yields a receiver having greatly reduced third order distortion even though the RF amplifier is bipolar. As another example, the surface wave device resonator utilized to generate 285 MHZ mixing signals may be comprised of a single transducer as opposed to a dual transducer. In a single transducer resonator, lead 233 couples to one set of electrodes on the transducer while lead 235 couples to the other set of electrodes. The single transducer is configured similar to transducer 243. As still another example, the channel selector of FIG. 1 or FIG. 21 may be readily adapted for use in systems other than television receivers. The channel selector has application wherever one channel of frequencies is desired to be selected from a plurality of nonoverlapping frequency channels. The information contained in the channels need not be television signals. Therefore, it will be understood that many changes and modifications can be made in the above details without departing from the nature and spirit of the invention. It is understood that the invention is not limited to said details except as set forth in the appended claims.

What is claimed is:

1. A radio frequency-intermediate frequency section of a frequency channel selector for obtaining a selected channel of frequencies from a plurality of non-overlapping frequency channels, said radio frequency-intermediate frequency section comprising:
   at least one mixing means including a metal semiconductor field effect transistor and having first and second inputs coupled to simultaneously receive radio frequency signals representative of the plurality of frequency channels and mixing signals of a selected intermediate frequency for frequency shifting the selected frequency channel to a predetermined center frequency in the intermediate frequency range; and
   acoustic surface wave filter means connected to the output of said mixing means for essentially passing only the channel of said predetermined center frequency.

2. A radio frequency-intermediate frequency section as set forth in claim 1, wherein said metal semiconductor field effect transistor of said at least one mixing means has a gate coupled to receive said mixing signals, a source coupled to receive said radio frequency signals representative of the plurality of frequency channels, and a drain coupled to the input of said acoustic surface wave filter means.

3. A radio frequency-intermediate frequency section as set forth in claim 1, wherein said at least one mixing means frequency shifts the selected frequency channel to between 300 MHZ and 400 MHZ.

4. A radio frequency-intermediate frequency section as set forth in claim 1, wherein said acoustic surface wave filter means includes substrate means for carrying thermally insensitive piezoelectric surface waves in the 0°–70° C. temperature range.

5. A radio frequency-intermediate frequency section as set forth in claim 4, wherein said substrate means of said acoustic surface wave filter means is made of quartz.

6. A radio frequency-intermediate frequency section as set forth in claim 5, wherein said acoustic surface wave filter means comprises a three-phase low-loss unidirectional filter.

7. A radio frequency-intermediate frequency section as set forth in claim 6, wherein said acoustic surface wave filter means has an in-band insertion loss of $\leq 3.5$dB, and a stop-band loss at 1.5MHZ above and below the passband of $\geq 65$dB.

8. A radio frequency-intermediate frequency section as set forth in claim 1, further including amplifier means having at least one metal semiconductor field effect transistor connected to the first input of said mixing means, said amplifier means having an input to receive said radio frequency signals representative of the plurality of frequency channels and an output coupled to the first input of said mixing means for transmitting low gain amplified signals representative of the plurality of frequency channels to said mixing means.

9. A radio frequency-intermediate frequency section as set forth in claim 8, further including voltage-controlled oscillator means having an output connected to the second input of said mixing means for providing the mixing signals of a selected intermediate frequency for frequency shifting the selected frequency channel to a predetermined center frequency.

10. A radio frequency-intermediate frequency section of a frequency channel selector for obtaining a selected channel of frequencies from a plurality of non-overlapping frequency channels, said radio frequency-intermediate frequency section comprising:
first and second mixing means, each of said mixing means including a metal semiconductor field effect transistor and having first and second inputs coupled to simultaneously receive radio frequency signals representative of the plurality of frequency channels and mixing signals of a selectable intermediate frequency for frequency shifting the selected frequency channel to a predetermined center frequency in the intermediate frequency range;
switching means connected to the outputs of said first and second mixing means; and
acoustic surface wave filter means connected to said switching means, said switching means being operable to alternately interconnect the outputs of said first and second mixing means to said acoustic surface wave filter means such that said acoustic surface wave filter means is effective to pass only the channel of said predetermined center frequency from the output of the mixing means to which said acoustic surface wave filter means is interconnected via said switching means.

11. A radio frequency-intermediate frequency section as set forth in claim 10, further including first and second amplifier means corresponding to said first and second mixing means, each of said first and second amplifier means including at least one metal semiconductor field effect transistor and having an input to receive said radio frequency signals representative of the plurality of frequency channels and an output coupled to the first input of the mixing means corresponding thereto for transmitting low gain amplified signals representative of the plurality of frequency channels to the first input of the said corresponding mixing means.

12. A radio frequency-intermediate frequency section as set forth in claim 11, further including first and second voltage-controlled oscillator means having outputs respectively connected to the second inputs of said first and second mixing means for providing mixing signals thereto of a selected intermediate frequency for frequency shifting the selected frequency channel to a predetermined center frequency in the intermediate frequency range.

* * * * *